(12) United States Patent
Eida et al.

(10) Patent No.: US 7,548,020 B2
(45) Date of Patent: Jun. 16, 2009

(54) ORGANIC EL DISPLAY DEVICE HAVING CERTAIN RELATIONSHIPS AMONG CONSTITUENT ELEMENT REFRACTIVE INDICES

(75) Inventors: Mitsuru Eida, Sodegaura (JP);
Kazuhiro Tomoike, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 11/205,015

(22) Filed: Aug. 17, 2005

(65) Prior Publication Data

US 2005/0275346 A1 Dec. 15, 2005

Related U.S. Application Data

(63) Continuation of application No. 10/111,284, filed on Apr. 22, 2002, now Pat. No. 6,963,168.

(51) Int. Cl.
*H05B 33/04* (2006.01)
*H05B 33/12* (2006.01)
*H01J 1/62* (2006.01)

(52) U.S. Cl. .................. 313/506; 313/501; 313/504; 313/512; 257/40; 257/79; 428/690; 428/917

(58) Field of Classification Search .......... 313/500–512
See application file for complete search history.

(56) References Cited

U.S. PATENT DOCUMENTS

| | | | | |
|---|---|---|---|---|
| 5,693,956 A | 12/1997 | Shi et al. | ...................... | 257/40 |
| 5,814,416 A | 9/1998 | Dodabalapur et al. | ....... | 428/690 |
| 5,869,929 A * | 2/1999 | Eida et al. | ................... | 313/501 |
| 6,157,127 A * | 12/2000 | Hosokawa et al. | .......... | 313/506 |
| 6,171,981 B1 | 1/2001 | Byun | .......................... | 638/785 |
| 6,215,250 B1 * | 4/2001 | Hirano et al. | ............ | 315/169.3 |
| 6,320,311 B2 | 11/2001 | Nakaya et al. | .............. | 313/506 |
| 6,399,222 B2 | 6/2002 | Arai et al. | .................... | 428/690 |
| 6,420,834 B2 | 7/2002 | Yamazaki et al. | ......... | 315/169.3 |
| 6,541,130 B2 | 4/2003 | Fukuda | ....................... | 428/690 |
| 6,573,652 B1 * | 6/2003 | Graff et al. | .................. | 313/512 |
| 6,628,353 B2 | 9/2003 | Nakamura | .................... | 349/95 |
| 6,633,121 B2 * | 10/2003 | Eida et al. | .................... | 313/504 |
| 6,653,778 B1 | 11/2003 | Tomiuchi et al. | ............ | 313/501 |
| 6,689,492 B1 * | 2/2004 | Yamazaki et al. | ........... | 428/690 |
| 2001/0026126 A1 | 10/2001 | Nakaya et al. | .............. | 313/506 |

FOREIGN PATENT DOCUMENTS

CN 11-31590 2/1999

(Continued)

OTHER PUBLICATIONS

Knoll, R.W. et al., "Optical and physical properties of sputtered Si:Al:O:N films," J. Mater. Res., vol. 7, No. 5, May 1992, pp. 1247-1252.

*Primary Examiner*—Sikha Roy
(74) *Attorney, Agent, or Firm*—Steptoe & Johnson LLP

(57) ABSTRACT

An organic EL display device having a supporting substrate; and an organic EL element including an organic luminescent medium sandwiched between a lower electrode and an upper electrode thereon. Various relationships are indicted among the refractive indices of the various elements of the organic EL display device. In such arrangement, a large quantity of EL emission can be taken to the outside.

10 Claims, 9 Drawing Sheets

FOREIGN PATENT DOCUMENTS

| | | |
|---|---|---|
| DE | 195 01 229 A1 | 7/1995 |
| EP | 0 421 494 A2 | 4/1991 |
| EP | 0 892 589 A | 1/1999 |
| JP | 7-272857 | 10/1995 |
| JP | 08142256 A * | 6/1996 |
| JP | 10-162958 | 6/1998 |
| JP | 10-214683 | 8/1998 |
| JP | 10-289784 | 10/1998 |
| JP | 11-185955 | 7/1999 |

* cited by examiner

PRIOR ART

ORGANIC EL DISPLAY DEVICE HAVING CERTAIN RELATIONSHIPS AMONG CONSTITUENT ELEMENT REFRACTIVE INDICES

REFERENCE TO RELATED APPLICATIONS

This application is a continuation of application Ser. No. 10/111,284, filed Apr. 22, 2002, now U.S. Pat. No 6,963,168.

TECHNICAL FIELD

The present invention relates to an organic EL display device, particularly an organic EL display device wherein the quantity of EL emission that can be taken out is large.

The "EL" described in claims and so on in the present description is an abbreviated representation of "electroluminescence".

BACKGROUND ART

Hitherto, attention has been paid to the utilization of EL displays using electroluminescence as luminescent elements in various display devices since the EL display devices have characteristics that the EL elements are capable of emitting light for itself, the capability of being watched and perceived is high, and they are superior in impact-resistance because of the perfect solid state thereof. Particularly, organic EL display devices using an organic compound as their luminescent material have been positively made practicable since the devices make it possible to lower voltage to be applied largely and can easily be made thin and small-sized so that the consumption power thereof can be made small.

Such an organic EL display device 100 is disclosed in JP-Laid/Open-Hei-10-289784 and JP-Laid/Open-Hei-11-185955. The outline of this device 100 is illustrated in FIG. 6. An organic EL element 130 is composed to sandwich an organic compound containing a luminescent layer 124 between a lower electrode (conductive layer) 122 deposited on a supporting substrate 121 and an upper electrode (hole injection electrode) 125, and a sealing member 126 for excluding the effect of moisture in the atmosphere is set above this organic EL element 130. Furthermore, a color filter layer 127 is disposed on the face, opposite to the organic EL element 130, of the sealing element 126. In the example of this organic EL element 130, a nonconductive layer 123 is arranged between the lower electrode 122 and the luminescent layer 124. A void (for example, gas such as nitrogen) layer 131 is present between the color filter layer 127 and the upper electrode 125.

Accordingly, by applying a given voltage between the upper and lower electrodes 122 and 125, EL emission passes from the side of the upper electrode 125, which is a transparent electrode, through the void layer 131, the color filter layer 127 and the sealing member 126 and then the EL emission can be taken out. In FIG. 6, an arrow represents the direction in which the EL emission is taken out.

As illustrated in FIG. 7, JP-Laid/Open-Hei-10-162958 discloses an organic EL display device 200 wherein color changing layers 201 and 202, a protective layer 203, a transparent electrode 204, an organic luminescent layer 205 and a rear electrode 220 are disposed below an insulating substrate (glass substrate) 210. The device 200 is composed so as to take out EL emission through the color changing layers 201 and 202 from the side of the transparent electrode 204.

Therefore, by applying a given voltage between the upper and the lower electrodes 204 and 220, EL emission passes from the side of the transparent electrode 204 through the protective layer 203, the color changing layers 201 and 202, and the insulating substrate 210 and then the EL emission can be taken out. In FIG. 7, an arrow represents the direction in which the EL emission is taken out.

In the case that light passes through an interface between two layers a and b made of constituent materials having different refractive indexes, the relationship between the reflectivity R of the interface (the reflectivity against light perpendicular to the interface) and the refractive indexes $n_a$ and $n_b$ of the constituent materials of the two layers is represented by the following:

$$R=(n_a-n_b)^2/(n_a+n_b)^2$$

As can be understood from this expression, therefore, the reflectivity R of the interface becomes larger as the difference between the refractive indexes $n_a$ and $n_b$ of the constituent materials of the two layers becomes larger. As a result, the quantity of the light transmitting through the interface decreases.

For example, when light is radiated from an indium zinc oxide (IZO, refractive index: 2.1) and the light comes through a void layer (refractive index: 1.0) into a glass substrate (refractive index: 1.5), the light quantity incoming in the glass substrate is reduced to 84% of the light quantity (100%) outgoing from the IZO on the assumption that the light absorbance of the respective layers themselves are zero.

However, according to the organic EL display devices disclosed in JP-Laid/Open-Hei-10-289784 and 11-185955, as the transparent conductive material constituting the upper electrode, an indium tin oxide (ITO) having a refractive index of about 2 or the like material is used, and the refractive index of the void (gas such as nitrogen) layer between the upper electrode and the sealing member is 1. Therefore, the refractive index difference between the upper electrode and the void layer and the refractive index difference between the void layer and the sealing member become large. In general, the color changing layers are also made of a polymer material having a far larger refractive index value than that of the void layer. For this reason, the refractive index difference between the void layer and the color changing layers also becomes large. This results in a problem that EL emission reflects on the respective interfaces so that the quantity of the EL emission which can be taken out becomes remarkably small.

In the organic EL display device disclosed in JP-Laid/Open-Hei-10-162958, the relationship between the refractive indexes of the respective layers is not considered. Therefore, EL emission reflects on the respective interfaces. The number of the layers through which the EL emission must transmit is large. These facts result in a problem that the quantity of the EL emission which can be taken out gets less.

JP-Laid/Open-Hei-7-272857 discloses an inorganic EL element formed on a supporting substrate and having a structure wherein, on its upper electrode side, a silicone oil (sealing agent) having a refractive index (s2) smaller than the refractive index (s1) of the upper electrode and a protective layer having a refractive index (s3) smaller than that of this silicone oil and larger than 1 are disposed and further EL emission is taken out from the side of the upper electrode.

However, when the silicone oil used in this inorganic EL element is used as a sealing agent of an organic EL element, the silicone oil may cause an organic luminescent medium in the organic EL element to be dissolved and invades into its layer interface to disturb its layer structure. Thus, the organic EL element may be deteriorated and the durability thereof may also be deteriorated.

In such an inorganic EL element, the luminescent brightness thereof is originally low. Thus, even if each of the refractive indexes of its upper electrode, sealing agent and protective layer is considered, it is practically difficult that the inorganic EL element exhibits performance equivalent to that of organic EL elements or is easily produced.

Thus, the inventors of the present invention have found out that by considering the relationship between the refractive indexes of a sealing member and a color changing medium and those of a transparent electrode and so on, the quantity of EL emission which can be taken out in an organic EL display device can be made large.

That is, an object is to provide an organic EL display device wherein even if a sealing member is set up and EL emission is taken out through the sealing member in a first invention, even if a color changing medium is set up and EL emission is taken out through the color changing medium in a second invention, or even if a color changing medium is arranged outside a supporting substrate and EL emission is taken out through the color changing medium in a third invention, reflection on each of interfaces is effectively suppressed so that the quantity of the EL emission which can be taken out is large.

DISCLOSURE OF THE INVENTION

According to the present invention (first invention), there is provided an organic EL display device (which may be referred to as a first organic EL display device) comprising; a supporting substrate; an organic EL element comprising an organic luminescent medium sandwiched between a lower electrode and an upper electrode on the supporting substrate; a sealing medium; and a sealing member; EL emission being taken out from the upper electrode; wherein a following expression (1) is satisfied $$n1 \geq n2 \geq n3 \tag{1}$$

wherein n1 represents a refractive index of the upper electrode, n2 represents a refractive index of the sealing medium, and n3 represents a refractive index of the sealing member.

It is sufficient for the present invention that the expressions about the refractive indexes described above are satisfied by at least the peak wavelength of EL emission or conversion light.

That is, such a structure makes it possible that even if the sealing member is provided and EL emission is taken out through the sealing member, reflection on each interface is suppressed so as to provide an organic EL display device having a large luminescence quantity.

In the first organic EL display device, it is preferred that the device further comprises a color filter and/or a fluorescent medium, that is, a color changing medium (which may be referred to as a first color changing medium) between the sealing medium and the sealing member; and a following expression (2) is satisfied $$n1 \geq n2 \geq n4 \geq n3 \tag{2}$$

wherein n4 represents a refractive index of the color changing medium.

Such a structure makes it possible that even if the sealing member is provided and further the first color changing medium is provided to display an image, reflection on each interface is suppressed so as to provide an organic EL display device having a large luminescence quantity.

In the first organic EL display device, it is preferred that the device further comprises a color changing medium (which may be referred to as a second color changing medium) on a surface of the sealing member, the surface opposite to a surface on which the sealing medium is arranged; and a following expression (3) is satisfied $$n2 \geq n2 \geq n3 \geq n4' \tag{3}$$

wherein n4' represents a refractive index of the color changing medium.

Such a structure makes it possible that even if the sealing member is provided and further the second color changing medium is provided to display an image, reflection on each interface is suppressed so as to provide an organic EL display device having a large luminescence quantity. Since the second color changing medium does not contact the sealing medium directly, the second color changing medium may not be deteriorated by the sealing medium. Moreover, it is possible to prevent the generation of snapping or the like resulting from irregularities on the surface of the second color changing medium.

In the first organic EL display device is formed, it is preferred that the refractive indexes n1 and n2 satisfy a following expression (4):

$$n2 \geq 0.7 \times n1 \tag{4}$$

Such a structure makes it possible to provide an organic EL display device having a larger luminescence quantity since the refractive index n1 of the upper electrode and the refractive index n2 of the sealing medium become nearer to each other.

In the first organic EL display device, it is preferred that the refractive index of the sealing medium is 1.56 or more.

Such a structure reduces danger of deterioration of the organic EL display device by the sealing medium and allows the selection of materials of the upper electrode and the sealing member among a wider range of various materials. A typical example of a sealing liquid having a refractive index of less than 1.56 is silicone oil. In the case that such silicone oil is used, this sealing liquid causes deterioration of the organic luminescent medium so that the durability thereof may decrease.

In the first organic EL display device, it is preferred that the sealing medium comprises a transparent resin and/or a sealing liquid.

Such a structure makes it possible to prevent display defects based on light scattering since the sealing medium can be handled with less influence by taking-in of bubbles and so on.

In the first organic EL display device, it is preferred that the sealing medium comprises a transparent inorganic material.

Such a structure makes it possible to improve the reliability of the organic EL display device without hindering luminescence of the organic EL and without oxidizing or deteriorating the organic EL element readily since the transparent inorganic material does not comprise water content, oxygen or low molecular monomers and has the higher blocking effect.

The wording "comprises a transparent inorganic material" includes the meaning of a transparent inorganic film or the material dispersed in the above-mentioned transparent resin or sealing liquid.

In the first organic EL display device, it is preferred that the upper electrode is made mainly of an indium zinc oxide.

The use of the indium zinc oxide in the upper electrode makes it possible to satisfy the above-mentioned expression (1) or (2) since the refractive index of the indium zinc oxide is as high as about 2.1.

According to another aspect (second invention) of the present invention, there is provided an organic EL display device (which may be referred to a second organic EL display device) comprising; a supporting substrate; and an organic EL element comprising an organic luminescent medium sandwiched between a lower electrode and an upper electrode, on the supporting substrate; a color changing medium (which may be referred to as a third color changing medium) and/or a transparent resin layer being arranged between the supporting substrate and the lower electrode; EL emission being taken out from the lower electrode; wherein any one of following expressions (5) to (8) is satisfied $$n5 \geq n6 \geq n8 \quad (5)$$

$$n5 \geq n7 \geq n8 \quad (6)$$

$$n5 \geq n6 \geq n7 \geq n8 \quad (7)$$

$$n5 \geq n7 \geq n6 \geq n8 \quad (8)$$

wherein n5 represents a refractive index of the lower electrode, n6 represents a refractive index of the color changing medium, n7 represents a refractive index of the transparent resin layer, and n8 represents a refractive index of the supporting substrate.

Such a structure makes it possible that even if the third color changing medium and the transparent resin layer are provided and EL emission is taken out from the lower electrode, reflection on each interface is suppressed so as to provide an organic EL display device having a large luminescence quantity.

The third color changing medium may be of monolayer structure composed of either of a color filter or a fluorescent medium, may be of multilayer structure wherein color filters and/or fluorescent mediums are laminated.

In the case that the color changing medium is of multilayer structure, in the above-mentioned expression (5), the refractive index n6 of the color changing medium is defined as follows.

That is, when the third color changing medium is of m-layer structure and the refractive indexes of the layers are represented by n6(1), n6(2), ... and, n6(m) from the lower electrode side, the expression (5) is defined as being satisfied by satisfying the expression (5)':

$$n5 \geq n6(1) \geq n6(2) \geq \ldots \geq n6(m) \geq n8 \quad (5)'$$

Therefore, for example, when the third color changing medium is of two-layer structure and further the refractive indexes of the two layers are represented by n6(1) and n6(2) from the lower electrode side, the expression (5) is defined as being satisfied by satisfying the expression (5)":

$$n5 \geq n6(1) \geq n6(2) \geq n8 \quad (5)''$$

The above-mentioned definition can be applied to not only the above-mentioned expressions (7) and (8), but also a refractive index of another layer constituting the organic EL display device.

According to a further aspect (third invention) of the present invention, there is provided an organic EL display device (which may be referred to a third organic EL display device) comprising; a supporting substrate; and an organic EL element comprising an organic luminescent medium sandwiched between a lower electrode and an upper electrode, on the supporting substrate; a color changing medium (which may be referred to as a fourth color changing medium) being arranged on a surface of the supporting substrate, the surface opposite to a surface on which the lower electrode is arranged; EL emission being taken out from the side of the lower electrode; wherein a following expression (9) is satisfied $$n5 \geq n8 \geq n9 \quad (9)$$

wherein n5 represents a refractive index of the lower electrode, n8 represents a refractive index of the supporting substrate, and n9 represents a refractive index of the color changing medium.

Such a structure makes it possible that even if EL emission is taken out through the fourth color changing medium from the lower electrode side, reflection on each interface is suppressed so as to provide an organic EL display device having a large luminescence quantity.

In the third organic EL display device, it is preferred that a transparent resin layer is arranged between the lower electrode and the supporting substrate, and a following expression (10) is satisfied;

$$n5 \geq n7 \geq n8 \geq n9 \quad (10)$$

wherein n7 represents a refractive index of the transparent resin layer.

Such a structure makes it possible that even if the fourth color changing medium and the transparent resin layer are provided to take out EL emission from the lower electrode side, reflection on each interface is suppressed so as to provide an organic EL display device having a large luminescence quantity.

In the third organic EL display device, it is preferred that the refractive index n5, and the refractive index n6 or n7 satisfy the following expression (11) or (12).

$$n6 \geq 0.7 \times n5 \quad (11)$$

$$n7 \geq 0.7 \times n5 \quad (12)$$

Such a structure makes it possible to provide an organic EL display device having a larger luminescence quantity since the refractive index n5 of the lower electrode becomes nearer to the refractive index n6 of the third color changing medium or the refractive index n7 of the transparent resin layer.

In the first, second or third organic EL display device, it is preferred that a thin film transistor (hereinafter referred to as a TFT) for driving the organic EL element is arranged on the supporting substrate.

Such a structure allows significantly low driving voltage with enhanced luminescence efficiency and lower power consumption.

BEST MODE FOR CARRYING OUT THE INVENTION

Figure 1:
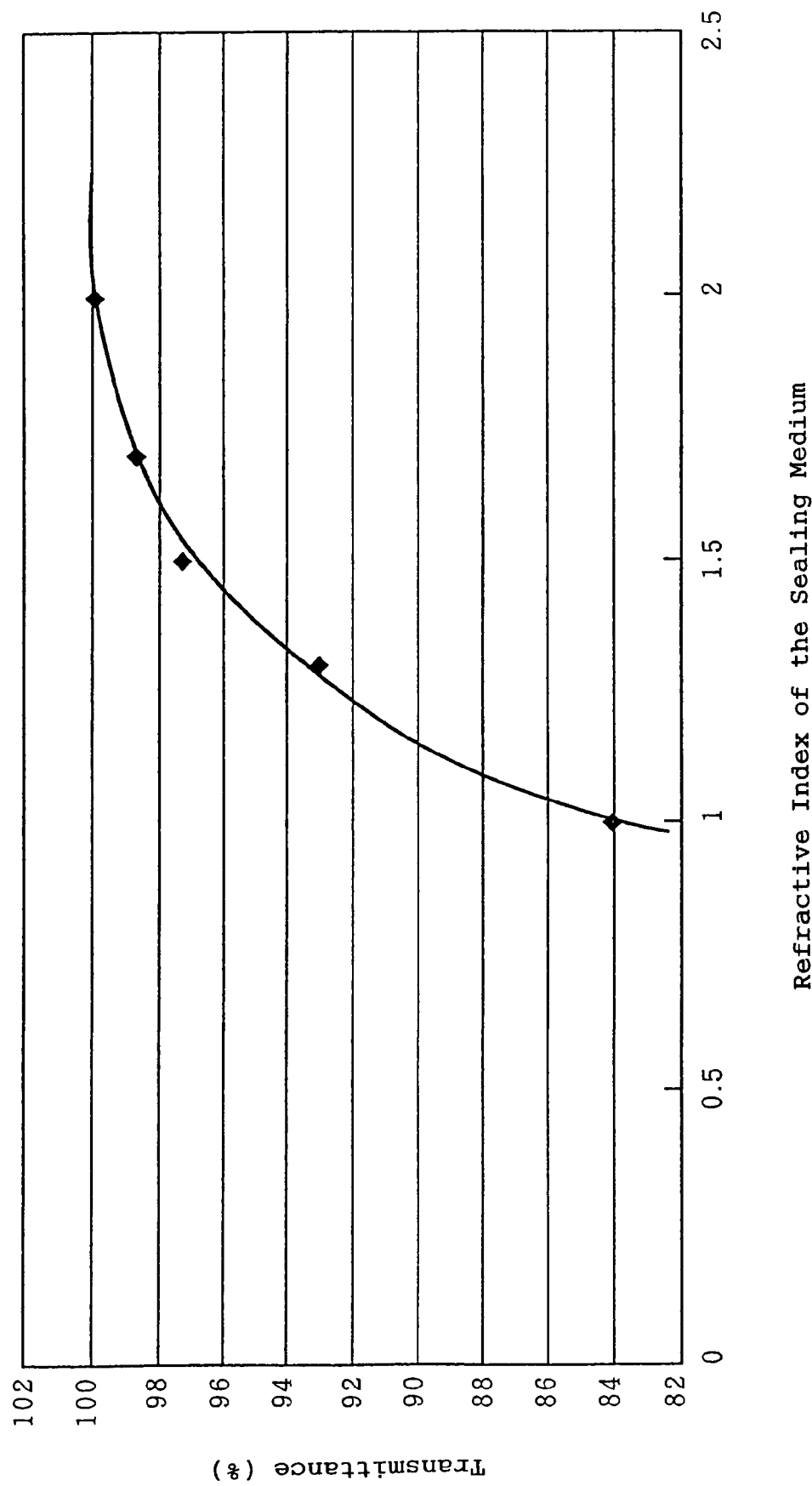
FIG. 1 is a graph showing relationship between the refractive index of a sealing medium and the transmittance thereof.

Embodiments of the present invention will be specifically described with reference to the drawings. In the drawings which are referred to, the size of respective constituent components, the shape thereof and the arrangement relationship therebetween are roughly illustrated in such a manner that this invention can be merely understood. Therefore, this invention is not limited to illustrated examples. In the drawings, hatching, which represents sections, may be omitted.

First Embodiment

Figure 2:
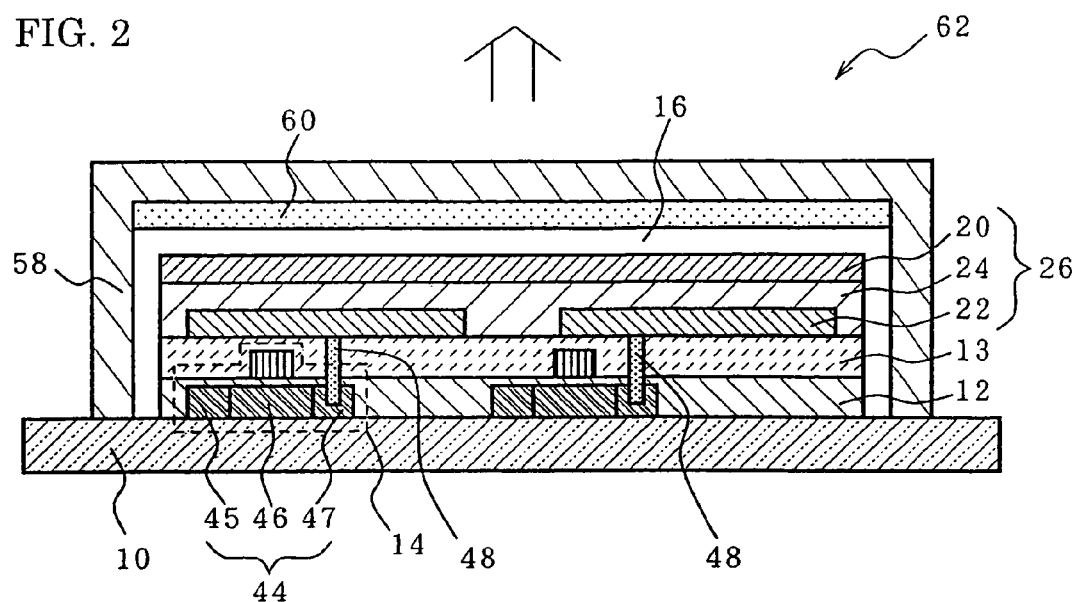
FIG. 2 is a sectional view of an organic EL display device in a first embodiment.

As illustrated in FIG. 2, the first embodiment is specifically an active matrix type organic EL display device 62 wherein TFTs 14 embedded in an electrically insulator (including a gate insulating film) 12, an inter-insulator (flattening film) 13, organic EL elements 26 and contact holes (electrically connecting members) 48 for connecting the TFTs 14 and the organic EL elements 26 electrically are disposed on a supporting substrate (which may be referred to only as a substrate) 10. The device 62 further comprises a sealing medium 16, a color changing medium 60 and a sealing member 58.

The refractive index of an upper electrode 20 in the organic EL element 26, that of the sealing medium 16 and that of the sealing member 58 are represented by n1, n2 and n3, respectively. In this case, the following expression (1) is satisfied in the active matrix type organic EL display device 62.

$$n1 \geq n2 \geq n3 \quad (1)$$

The following will describe the constituent elements and so on in the first embodiment, referring to FIG. 2 and so on.

1. Refractive Index

① Expression (1)

In the organic EL display device of the first embodiment, the refractive indexes of the respective layers satisfy at least the expression (1), as described above.

That is, by satisfying the expression (1) in this way, the reflectance of EL on interfaces between the respective layers can be reduced so that an organic EL display device having a large luminescence quantity can be provided.

For example, when light is radiated from the upper electrode made of an indium zinc oxide (IZO, refractive index: 2.1) and the light comes through the sealing medium (refractive index: 1.7) into the sealing member (refractive index: 1.5), the quantity of the light which can come in the sealing member becomes a high value, such as 98.6% of the quantity (100%) of the light outgoing from the upper electrode on the assumption that the light absorbance of the respective layers themselves are 0%. In other words, it can be understood that light hardly reflects on the respective interfaces.

Assuming, as a model, a case in which light is radiated outside from the side of the upper electrode (IZO, refractive index: 2.1) and then the light comes through the sealing medium into the sealing member (refractive index: 1.5) in the organic EL element made illustrated in FIG. 2, the relationship between the refractive index of the sealing medium and the quantity of the light incoming in the sealing member can be shown as in FIG. 1. Namely, in FIG. 1, its transverse axis represents the refractive index value of the sealing medium and its vertical axis represents the transmittance (%) of the sealing medium, that is, the percentage of the quantity of the light incoming in the sealing member. For example, when this transmittance is 100(%), it is meant that all EL emission taken out from the organic EL element comes in the sealing member without being absorbed in the sealing medium or reflected thereon.

As can be understood from FIG. 1, when the expression (1) is satisfied and the refractive index of the sealing medium becomes nearer to the refractive index value of the upper electrode, the percentage of the quantity of the light incoming in the sealing medium tends to be larger.

In this example, therefore, a high transmittance of 97% or more can be obtained in the sealing medium by satisfying the expression (1).

The refractive index is defined as a refractive index relative to 1 as the value of vacuum. If interfaces between the respective layers of the upper electrode, the sealing medium and the sealing member are mixed with each other to be indefinite, the mixed layer is defined as an average refractive index. However, even if the mixed layer is present, it is preferred that the average refractive index becomes smaller successively from the upper electrode to the sealing member.

② Expression (2)

As illustrated in FIG. 2, when the first color changing medium 60 is arranged between the sealing medium 16 and the sealing member 58 and further the refractive index of the first color changing medium 60 is represented as n4 in the organic EL display device 62 of the first embodiment, it is more preferred to satisfy the above-mentioned expression (1) and further satisfy the following expression (2).

$$n1 \geq n2 \geq n4 \geq n3 \quad (2)$$

When in such a structure, light is radiated from the upper electrode made of, for example, an indium zinc oxide (IZO, refractive index: 2.1) and then the light comes through the sealing medium (refractive index: 1.6) and the first color changing medium (refractive index: 1.55) into the sealing member (refractive index: 1.5), the quantity of the light which can come in the sealing member becomes a high value of 98% of the light quantity (100%) outgoing from the upper electrode on the assumption that the light absorbance of the respective layers themselves are 0%.

③ Expression (3)

When the second changing medium is disposed on the side, opposite to the sealing medium, of the sealing member, that is, the side which contacts the air and further the refractive index of the second color changing medium represented as n4' in the organic EL display device of the first embodiment, it is more preferred to satisfy the above-mentioned expression (1) and further satisfy the following expression (3).

$$n1 \geq n2 \geq n3 \geq n4' \quad (3)$$

When in such a structure, light is radiated from the upper electrode made of, for example, an indium zinc oxide (IZO, refractive index: 2.1) and then the light comes through the sealing medium (refractive index: 1.7) and the sealing member (refractive index: 1.55) into the second color changing medium (refractive index: 1.5), the quantity of the light which can come in the second color changing medium becomes a high value of 99% of the light quantity (100%) outgoing from the upper electrode on the assumption that the light absorbance of the respective layers themselves are 0%.

④ Expression (4)

In the organic EL display device of the first embodiment, it is preferred that the refractive index n1 of the upper electrode and the refractive index n2 of the sealing medium satisfy the above-mentioned expression (1) and further satisfy the following expression (4).

$$n2 \geq 0.7 \times n1 \quad (4)$$

When in such a structure, light is radiated from the upper electrode made of, for example, an indium zinc oxide (IZO, refractive index: 2.1) and then the light comes through the sealing medium (refractive index: 1.55) into the sealing member (refractive index: 1.5), the quantity of the light which can come in the sealing medium becomes a high value of 98% of the light quantity (100%) outgoing from the upper electrode on the assumption that the light absorbance of the respective layers themselves are 0%.

2. Substrate (1) Kind

The substrate (which may be referred to as the supporting substrate) in the organic EL display device is a member for supporting the organic EL elements, TFTs and so on. It is therefore preferred that the mechanical strength and the dimensional stability thereof are superior.

Examples of such a substrate are substrates made of an inorganic material, such as a glass plate, a metal plate, and a ceramic plate. Preferred examples of the inorganic material include glass material, silicon oxide, aluminum oxide, titanium oxide, yttrium oxide, germanium oxide, zinc oxide, magnesium oxide, calcium oxide, strontium oxide, barium oxide, lead oxide, sodium oxide, zirconium oxide, sodium oxide, lithium oxide, boron oxide, silicon nitride, soda lime glass, barium/strontium-containing glass, lead glass, aluminosilicate glass, borosilicate glass, and barium borosilicate glass.

Preferred examples of an organic material constituting the substrate include polycarbonate resin, acrylic resin, vinyl chloride resin, polyethylene terephthalate resin, polyimide resin, polyester resin, epoxy resin, phenol resin, silicone resin, fluorine resin, polyvinyl alcohol resin, polyvinyl pyrrolidone resin, polyurethane resin, epoxy resin, cyanate resin, melamine resin, maleic resin, vinyl acetate resin, polyacetal resin and cellulose resin.

(2) Surface Treatment, and So On

In order to avoid the invasion of moisture into the organic EL display device, it is also preferred that the substrate made of any one of these materials is subjected to moisture-proof treatment or hydrophobic treatment by forming an inorganic film or applying fluorine resin.

This is particularly effective when an organic material such as a polymer is used.

In order to avoid the invasion of moisture into the organic luminescent medium, it is preferred to make the water content in the substrate and the gas permeability coefficient thereof small. Specifically, it is preferred that the water content in the supporting substrate is 0.0001% by weight or less and the gas permeability coefficient is $1 \times 10^{-13}$ cc·cm/cm²·sec·cmHg or less.

In order to take out EL emission from the side of the upper electrode in the first embodiment, it is unnecessary that the substrate itself has transparency. However, in the case that EL emission is taken out through the substrate (also in the case of use as the sealing member), it is preferred to use, among the above-mentioned substrate materials, the substrate material having a light transmittance of 70% or more particularly at a wavelength of 400 to 700 nm.

(3) Refractive Index

It is preferred to set the refractive index of the substrate in the range of 1.4 to 1.8. This is because by setting the refractive index within such a range the constituent material of the substrate which can be used can be selected from wider range of materials.

This is also because by setting the refractive index of the substrate in such a range, the above-mentioned expressions can be satisfied in the relationships to the refractive index of the upper electrode and that of the lower electrode.

Furthermore, this is because such a substrate makes it possible to suppress reflection on the surface of the substrate, even if EL emission is taken out through the substrate.

For reference, the values of the refractive indexes of preferred substrates are as follows:

| | |
|---|---|
| methyl methacrylate resin | 1.49 |
| silicon oxide ($SiO_2$) | 1.54 |
| boron oxide ($B_2O_3$) | 1.77 |
| glass | 1.49-1.50 |
| tetrafluoroethylene resin | 1.49 |

3. Organic EL Element (1) Organic Luminescent Medium

The organic luminescent medium can be defined as a medium containing an organic luminescent layer wherein an electron and a hole are recombined with each other so that EL can be emitted. This organic luminescent medium can be made, for example, by depositing the following layers on an anode:

① organic luminescent layer
② hole injection layer/organic luminescent layer
③ organic luminescent layer/electron injection layer
④ hole injection layer/organic luminescent layer/electron injection layer
⑤ organic semiconductor layer/organic luminescent layer ⑥ organic semiconductor layer/electron barrier layer/organic luminescent layer ⑦ hole injection layer/organic luminescent layer/adhesion improving layer Among these, the structure ④ is preferably used since it can give a higher luminescent brightness and is also superior in durability.

① Constituent material

Examples of the luminescent material in the organic luminescent medium include one or a combination of two or more selected from p-quaterphenyl derivatives, p-quinquphenyl derivatives, benzothiazole compounds, benzoimidazole compounds, benzoxazole compounds, metal-chelated oxinoid compounds, oxadiazole compounds, styrylbenzene compounds, distyrylpyrazine derivatives, butadiene compounds, naphthalimide compounds, perylene derivatives, aldazine derivatives, pyrazine derivatives, cyclopentadiene derivatives, pyrrolopyrrole derivatives, styrylamine derivatives, coumarin compounds, aromatic dimethylidyne compounds, metal complexes having a ligand of a 8-quinolynol derivative, and polyphenyl compounds.

Among these organic luminescent materials, 4,4'-bis(2,2-di-t-butylphenylvinyl)biphenyl (abbreviated to DTBPBBi) and 4,4'-bis(2,2-diphenylvinyl)biphenyl (abbreviated to DPVBi) as aromatic dimethylidyne compounds, and derivatives thereof are more preferred.

Furthermore, it is preferred to use a material wherein an organic luminescent material having a distyrylarylene skeleton or the like, as a host material, is doped with a fluorescent dye giving intense blue and red fluorescence, for example, a coumarin material, or a fluorescent dye similar to the host, as a dopant. More specifically, it is preferred to use the above-mentioned DPVBi or the like as a host and use N,N-diphenylaminobenzene (abbreviated to DPAVB) as a dopant.

It is also preferred to use a high molecular material (number average molecular weight: 10000 or more) as well as the above-mentioned low molecular material (number average molecular weight: less than 10000).

Specific examples thereof include polyarylene vinylene, derivatives thereof (PPV), polyfluorene, derivatives thereof, and fluorene-containing copolymers.

② Thickness

The thickness of the organic luminescent medium is not particularly limited. It is however preferred to arrange the thickness in the range of, for example, 5 nm to 5 µm.

The reasons for this are as follows: if the thickness of the organic luminescent medium is below 5 nm, the luminescent brightness and durability thereof may deteriorate, and if the thickness of the organic luminescent medium is over 5 µm, the value of the voltage to be applied may become high.

Therefore, the thickness of the organic luminescent medium is more preferably in the range of 10 nm to 3 µm, and is still more preferably in the range of 20 nm to 1 µm.

(2) Electrodes

The following will describe an anode layer and a cathode layer as the electrodes. The anode layer and the cathode layers become the upper and the lower electrodes, respectively, or the lower and upper electrodes, respectively, dependently on the structure of the organic EL element.

① Anode Layer

It is preferred to use, for the anode layer, a metal, an alloy or an electrically conductive compound having a large work function (for example, 4.0 eV or more), or a mixture thereof. Specifically, it is preferred to use one or a combination of two or more selected from indium tin oxide (ITO), indium zinc oxide (IZO), indium copper (CuIn), tin oxide ($SnO_2$), zinc oxide (ZnO), gold, platinum, palladium and so on.

By using these electrode materials, the anode layer having a uniform thickness can be made by a method making film-deposition in a dry state possible, such as vacuum deposition, sputtering, ion plating, electron beam evaporation, CVD (chemical vapor deposition), MOCVD (metal oxide chemical vapor deposition), or plasma CVD.

In the case that EL emission is taken out from the side of the anode layer, it is necessary to make the anode layer to a transparent electrode. On the other hand, in the case that EL emission is not taken out, it is unnecessary to make the anode electrode to a transparent electrode. Therefore, in the case that the anode layer is made to a transparent electrode, it is preferred to use a transparent conductive material such as ITO, IZO, CuIn, $SnO_2$, or ZnO, and provide the transmittance of EL emission to a value of 70% or more.

The film thickness of the anode layer is not particularly limited. The thickness is preferably in the range of, for example, 10 to 1,000 nm, and is more preferably in the range of 10 nm to 200 nm.

The reason for this is as follows: by setting the film thickness of the anode layer in such a range, good electrically connecting reliability can be obtained between the anode layer and electrically connecting members made of IZO, and further such a film thickness makes it possible to obtain the transmittance of EL emission, for example, 70% or more.

In the case that EL emission is taken out from the side of the anode layer, it is preferred to set the refractive index of the anode layer in the range of 1.6 to 2.2. This is because, by setting the refractive index in such a range, it is possible to satisfy the above-mentioned expressions (1) and so on easily, and anode materials which can be used are selected from wider range of materials.

It is therefore more preferred to set the refractive index of the anode layer in the range of 1.7 to 2.1.

In order to make the adjustment of the relationships about the refractive indexes easy, it is more preferred to use an indium zinc oxide (refractive index: 2.1) among the above-mentioned constituent materials of the anode layer.

② Cathode Layer

It is preferred to use, for the cathode layer, a metal, an alloy or an electrically conductive compound having a small work function (for example, less than 4.0 eV), a mixture thereof, or an inclusion thereof.

Specifically, it is preferred to use one or a combination of two or more selected from sodium, sodium-potassium alloy, cesium, magnesium, lithium, magnesium-silver alloy, aluminum, aluminum oxide, aluminum-lithium alloy, indium, rare earth metals, mixtures of any one of these metals and an organic luminescence medium material, mixtures of any one of these metals and an electron injection layer material, and so on.

The film thickness of the cathode layer is not particularly limited in the same way as in the anode layer. Specifically, the thickness is preferably in the range of 10 to 1,000 nm, and is more preferably in the range of 10 nm to 200 nm.

The reason for this is as follows: by setting the film thickness of the cathode layer in such a range, good electrically connecting reliability can be obtained between the cathode layer and electrically connecting members made of IZO, and further such a film thickness makes it possible to obtain the transmittance of EL emission, for example, 10% or more, more preferably 70% or more.

In the case that light is taken out from the side of the cathode layer, it is preferred to set the refractive index of the cathode layer in the range of 1.6 to 2.2 in the same way as in the case of the anode layer.

(3) Inter-insulator

The interlayer dielectric in the organic EL display device of the present invention is present near or around the organic EL elements and the TFTs, and causes the unevenness of a luminescent medium or a color filter to be flattened, so as to be used mainly as a flattened undercoat when the lower electrode of the organic EL element is formed. The interlayer dielectric is also used to attain electric insulation for forming high resolution wiring materials, electric insulation (prevention of short circuits) between the lower and upper electrodes of the organic EL element, electrical insulation or mechanical protection of the TFT, electrical insulation between the TFT and the organic EL element, and so on.

Therefore, the inter-insulator may be called a flattening film, an electrically insulating film, a partition, a spacer, or the like if necessary. The present invention embraces all of them.

① Constituent Material

Examples of the constituent material used for the inter-insulator usually include acrylic resin, polycarbonate resin, polyimide resin, fluorinated polyimide resin, benzoguanamine resin, melamine resin, cyclic polyolefin, Novolak resin, polyvinyl cinnamate, cyclic rubber, polyvinyl chloride resin, polystyrene, phenol resin, alkyd resin, epoxy resin, polyurethane resin, polyester resin, maleic acid resin, and polyamide resin.

In the case that the inter-insulator is composed of an inorganic oxide, examples of preferred oxides include silicon oxide ($SiO_2$ or $SiO_x$), aluminum oxide ($Al_2O_3$ or $AlO_x$), titanium oxide ($TiO_2$), yttrium oxide ($Y_2O_3$ or $YO_x$) germanium oxide ($GeO_2$ or $GeO_x$), zinc oxide (ZnO), magnesium oxide (MgO or $MgO_x$), calcium oxide (CaO), boric acid ($B_2O_3$), strontium oxide (SrO), barium oxide (BaO), lead oxide (PbO), zirconia (ZrO), sodium oxide ($Na_2O$), lithium oxide ($Li_2O$), and potassium oxide ($K_2O$). The symbol x in the structural formulae representing the inorganic oxides is in the range of 1 to 3.

In the case that heat-resistance is particularly required, it is preferred to use acrylic resin, polyimide resin, fluorinated polyimide, cyclic polyolefin, epoxy resin, or any inorganic oxide among these constituent materials of the inter-insulator.

These inter-insulator can be worked into a desired pattern by introducing a photosensitive group thereto and using photolithography, or can be formed into a desired pattern by printing.

② Thickness of the Inter-insulator, and So On

The thickness of the inter-insulator depends on the resolution of display, and the degree of the unevenness of a fluorescent medium or a color filter combined with the organic EL element, and is preferably in the range of 10 nm to 1 mm.

This is because such a structure makes it possible to make the unevenness of the fluorescent medium or the color filter sufficiently flat or reduce the dependency of the high resolution display on viewing angle.

Accordingly, the thickness of the inter-insulator is more preferably in the range of 100 nm to 100 μm, and is still more preferably in the range of 100 nm to 10 μm.

4. Sealing Member

① Structure of the Sealing Member

In order to prevent moisture from invading the inside of the organic luminescent medium 24, it is preferred that the sealing member 58 illustrated in FIG. 2 is covered at least the luminescent area of the organic EL display device 62.

As such a sealing member, the same material for the supporting substrate can be used. Particularly, a glass plate having a high effect of shielding moisture or oxygen can be used. The form of the sealing member is not particularly limited, and is preferably, for example, a plate form or a cap form. For example, in the case of a plate form, the thickness thereof is preferably in the range of 0.01 to 5 mm.

It is also preferred that the sealing member is fitted into a groove or the like made in a part of the supporting substrate under pressure and is then fixed thereto, or that the sealing member is fixed to a part of the supporting member with a photo-setting adhesive agent or the like.

② Sealing Medium

The sealing medium is preferably arranged between the sealing member and the organic EL display device. Examples of such a sealing medium include a transparent resin, a sealing liquid and a transparent inorganic material.

The refractive index of the sealing medium is preferably 1.5 or more. The reason is as follows: since the sealing medium contacts the transparent electrode (refractive index: about 1.6 to 2.1), the refractive index of the sealing medium can be made near to that of the transparent electrode by setting the refractive index of the sealing medium 1.5 or more. In this way, reflection of light on the interface therebetween can be suppressed.

Since reflection of light on the interface between the transparent electrode and the sealing medium can be more suppressed and the kind of the constituent material of the sealing medium is not excessively restricted, the refractive index of the sealing medium is more preferably 1.56 or more, and is still more preferably in the range of 1.58 to 2.0.

It is also preferred to use, as a main component, an aromatic ring containing compound, a fluorene skeleton containing compound, a bromine containing compound, or a sulfur containing compound in the transparent resin or the sealing liquid constituting the sealing medium, or add the same, as a refractive index adjusting agent, thereto. This is because such a compound has a relatively high refractive index and makes it possible to adjust the refractive index flexibly if necessary.

Furthermore, in the case that the sealing medium is a transparent resin, the resin is preferably a ultraviolet ray setting resin, a visible ray setting resin, a thermosetting resin, or an adhesive agent using such a resin. Specific examples thereof include Luxtrak LCR0278 and 0242D (both of which are made by Toagosei Co., Ltd., TB3102 (epoxy type, made by Three Bond Co., Ltd.) and Venefix VL (acrylic type, made by Adel Co., Ltd.), which are commercially available.

More preferred examples of the transparent resin constituting the sealing medium are as follows:

polyphenyl methacrylate (refractive index: 1.57)
polyethylene terephthalate (refractive index: 1.58)
poly-o-chlorostyrene (refractive index: 1.61)
poly-o-naphthyl methacrylate (refractive index: 1.61)
polyvinyl naphthalene (refractive index: 1.68)
polyvinyl carbazole (refractive index: 1.68)
polyester containing fluorene skeleton (refractive index: 1.61 to 1.64)

It is also preferred to add alkoxy titanium such as dimethoxy titanium or diethoxy titanium in the transparent resin or the sealing liquid constituting the sealing medium.

The addition of the alkoxy titanium in this way makes it possible to make the refractive index of the transparent resin or the sealing liquid to a higher value.

A transparent inorganic material is preferably contained as the sealing medium. Examples of the transparent inorganic material include $SiO_2$, $SiO_x$, $SiO_xN_y$, $Si_3N_4$, $Al_2O_3$, $AlO_xN_y$, $TiO_2$ and $TiO_x$.

In the case of forming the transparent inorganic material film, the film is preferably formed at a low temperature (100° C. or lower) and a slow film-forming speed in order that the organic EL element is not deteriorated. Specifically, a method such as sputtering, vapor deposition or CVD is preferred.

These transparent inorganic material films are preferably in an amorphous form since the amorphous films have a high effect of shielding moisture, oxygen, a low molecular monomer and so on and suppress the deterioration of the organic EL element.

In the case of forming a layer wherein the transparent inorganic material is dispersed, a solution wherein transparent inorganic material particles are dispersed in the transparent resin or the sealing liquid is prepared and this solution may be made into a film by spin coating, roll coating or casting. Alternatively, the inorganic material in a liquid form may be injected under the sealing member.

In the above-mentioned sealing medium, layers made of materials of different kinds may be composed as plural layers.

In the case that the sealing medium is composed of plural layers but the refractive indexes of the respective layers are indefinite, the average refractive index of the plural layers may be defined as the refractive index of the sealing medium. In this case, however, it is necessary that the magnitude order of the upper electrode (n1), the sealing medium (n2) and the sealing member (n3) is as follows: $n1 \geq n2 \geq n3$ 5. Thin Film Transistor (TFT)

(1) Structure

One embodiment of the organic EL display device of the present invention has the plural TFTs 14 and the plural organic EL elements 26 driven correspondingly to the TFTs 14 on the substrate 10, as illustrated in FIG. 2.

As illustrated in FIG. 2, the flattened inter-insulator 13 is arranged between the TFTs 14 and the lower electrodes 22 of the organic EL elements 26, and further the drain 47 of the TFT 14 and the lower electrode 22 of the organic EL element 26 are electrically connected to each other through the contact hole 48 made in the inter-insulator 13.

Figure 4:
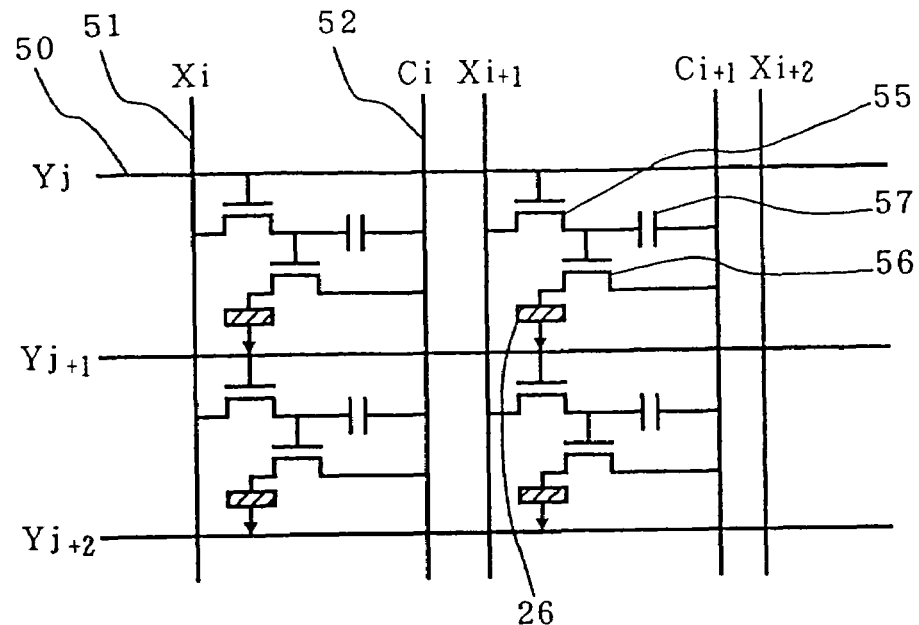
FIG. 4 is a circuit diagram of one example of active driving type organic EL display devices.

A circuit diagram in one example of such an organic EL display device is illustrated in FIG. 4. This circuit diagram illustrates the following: gate lines (scanning electrode lines) and source lines (signal electrode lines) are formed on the substrate so as to be in an XY matrix form. About each pixel, the following are connected to the gate lines and the source lines: two TFTs 55 and 56 and a condenser 57 for holding the gate of the second TFT 55 at a constant voltage. In this manner, the organic EL element 62 can be driven by the second TFT 56.

Figure 5:
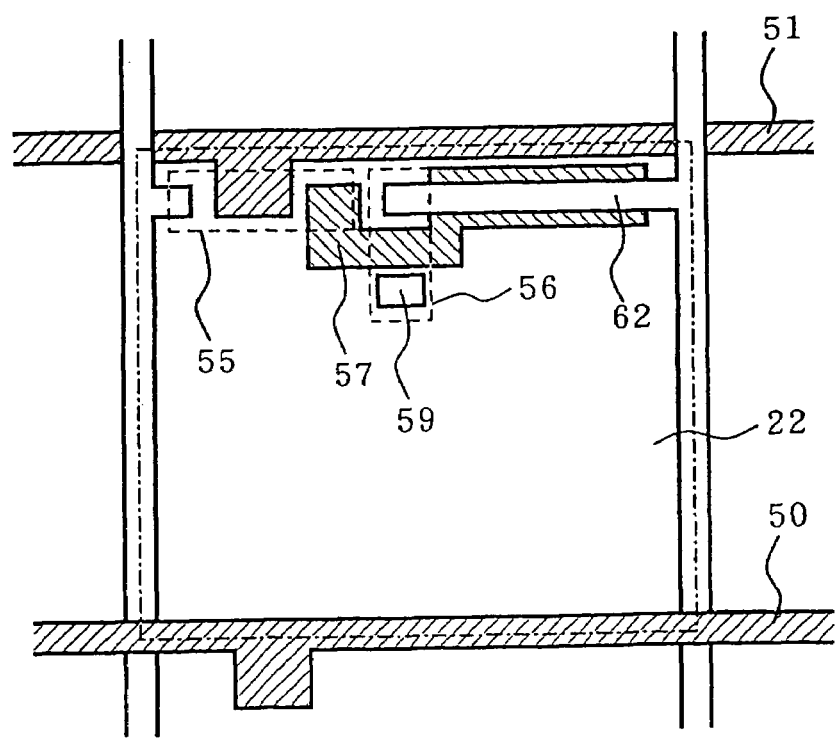
FIG. 5 is a perspective view in a plane direction of the active driving type organic EL display device according to the circuit diagram illustrated in FIG. 4.
Figure 6:
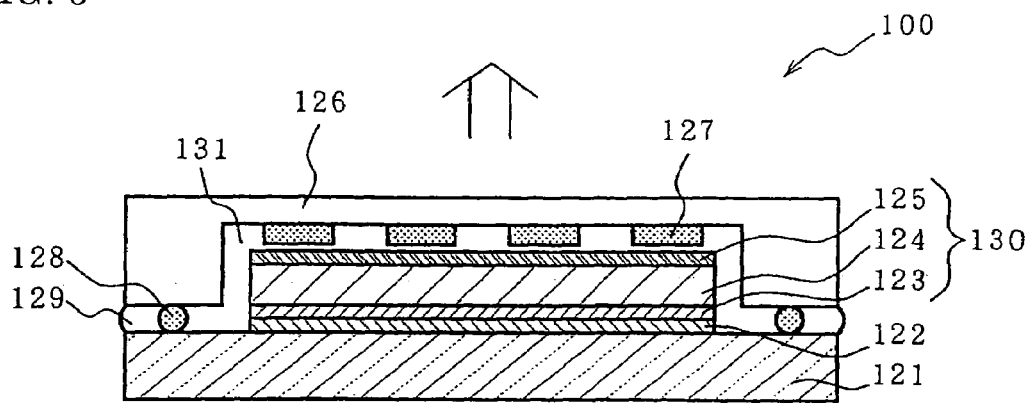
FIG. 6 is a sectional view of a conventional organic EL display device (No. 1).
Figure 7:
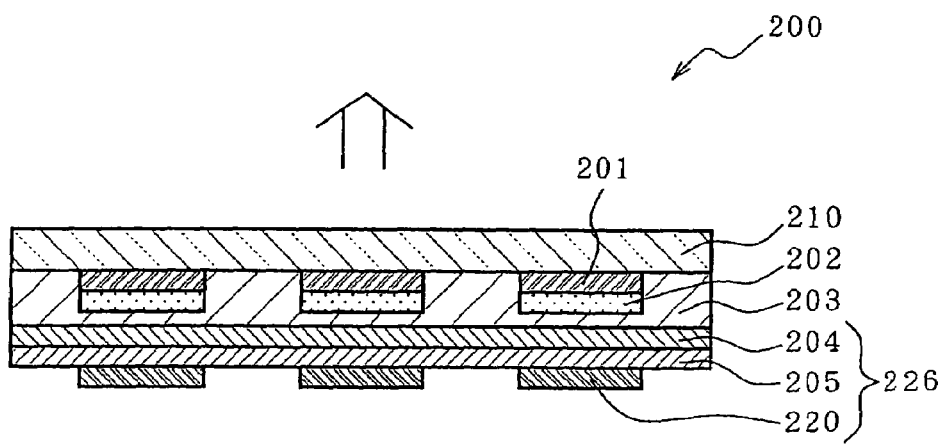
FIG. 7 is a sectional view of a conventional organic EL display device (No. 2).

FIG. 5 is a perspective view in a plane direction of the organic EL display device according to the circuit diagram illustrated in FIG. 4.

Preferably, plural scanning electrode lines ($Y_j$ to $Y_{j+n}$) 50 and signal electrode lines ($X_i$ to $X_{i+n}$) 51 arranged in an XY matrix form are also electrically connected to the TFTs 55 and 56 so as to make electric switches for driving the organic EL elements 26, as illustrated in FIG. 4.

That is, the electric switches are composed of the scanning electrode lines and the signal electrode lines which are electrically connected and, for example, the following: the first transistor(s) (which may be referred to as Tr1 hereinafter) 55, the second transistor(s) (which may be referred to as Tr2 hereinafter) and condenser(s) 57, the number of each of which is one or more.

The first transistor 55 has a function of selecting one out of luminescent pixels, and the second transistor 56 has a function of driving one of the organic EL elements.

An active layer 44 of each of the first transistor (Tr1) 55 and the second transistor (Tr2) 56 can be represented by $n^+/i/n^+$. As illustrated in FIG. 2, the regions $n^+$ at the both side are composed of semiconductor regions 45 and 47 doped in an n type, and the region i therebetween is composed of a non-doped semiconductor region 46.

The semiconductor regions doped in an n type become a source 45 and a drain 47, which constitute each of the transistors 55 and 56 as illustrated in FIG. 4, together with a gate disposed, across a gate oxide film, on the non-doped semiconductor region.

In the active layer 44, the semiconductor regions 45 and 47, which are doped in an n type, may be doped in a p type instead of the n type so as to produce a structure of $p^+/i/p^+$.

The active layers 44 of the first transistor (Tr1) 55 and the second transistor (Tr2) 56 are preferably made of an inorganic semiconductor such as polysilicone, or an organic semiconductor such as thiophene oligomer or poly(p-phenylenevinylene). Polysilicone is a particularly preferable material since it has more sufficient stability against electric conduction than amorphous Si (α-Si).

(2) Driving Method

The following will describe the method of driving the organic EL element by the TFT.

As illustrated in FIG. 4, the TFT comprises the first transistor (Tr1) 55 and the second transistor (Tr2) 56, and further constitutes the electric switch.

Therefore, by inputting a scanning signal pulse and a signal pulse through an X-Y matrix to this electric switch to perform switching action, the organic EL element 26 connected to this electric switch can be driven. As a result, the organic EL element 26 gives luminescence or the luminescence is stopped so that image display can be performed.

That is, by a scanning pulse transmitted through the scanning electrode lines (which may be referred to as gate lines) ($Y_j$ to $Y_{j+n}$) 50 and a signal pulse transmitted through the signal electrode lines ($X_i$ to $X_{i+n}$) 51, a desired one out of the first transistors (Tr1) 55 is selected so that a given amount of charges is given into the condenser 57 formed between common electrode lines ($C_i$ to $C_{i+n}$) 52 and the first transistor (Tr1) 55, as illustrated in FIG. 4.

In this way, the gate voltage of the corresponding second transistor (Tr2) 56 becomes a constant value so that the second transistor (Tr2) 56 turns on. In this ON-state, the gate voltage is held until the next gate pulse is transmitted. Therefore, electric current is continuously supplied to the lower electrode 22 of the organic EL element 26 connected to the drain of the second transistor (Tr2) 56.

The organic EL element 26 is driven by the supplied electric current. Thus, the driving voltage thereof is largely reduced and the luminescent efficiency thereof is improved. Moreover, the power consumption thereof can be reduced.

6. Electrically Connecting Member

In the first embodiment, the electrically connecting member is preferably made of a noncrystalline conductive oxide, for example, indium zinc oxide (IZO), as well as a metal material.

That is, due to the characteristics of the noncrystalline conductive oxide, such as moisture resistance and heat resistance, good electric connection can be obtained between the organic EL element and the TFT.

And due to the excellent etching property that the noncrystalline conductive oxide has, the electrically connecting member superior in precision can easily be formed.

Furthermore, the noncrystalline conductive oxide has a characteristic of being superior in the capability of electrical connection to the transparent electrode.

The noncrystalline conductive oxide preferably contains, as a dopant or dopants for adjusting electric conductivity, for example, one or a combination of two or more selected from Sn, Sb, Ga, Ge and so on.

Second Embodiment

Figure 3:
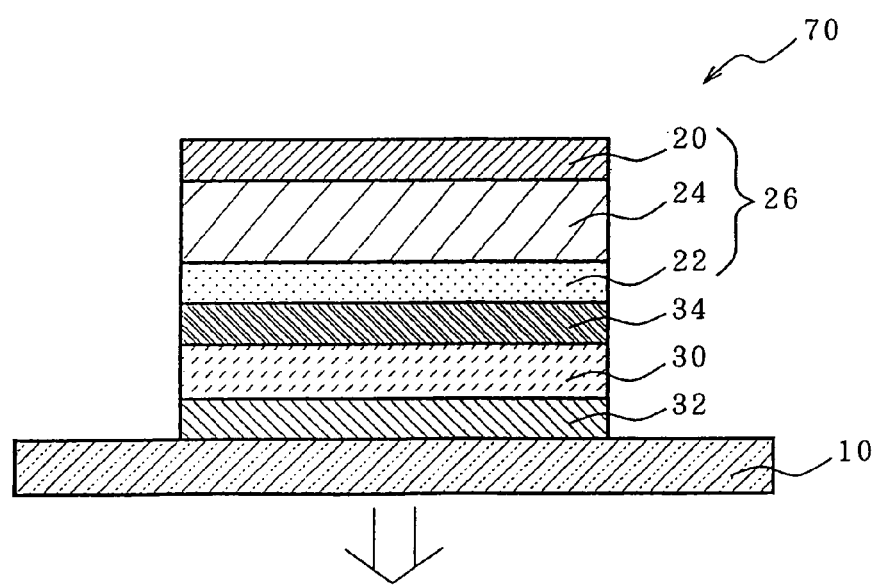
FIG. 3 is a sectional view of an organic EL display device in a second embodiment.

As is roughly illustrated in FIG. 3, an organic EL display device 70 of the second embodiment is an organic EL display device having the following characteristics: the device 70 comprises, on a supporting substrate 10, third color changing medium 30 and 32, a transparent resin layer (which may be referred to as a first transparent resin layer) 34, and an organic EL element 26 made of an organic luminescent medium 24 sandwiched between a lower electrode 22 and an upper electrode 20; EL emission is taken out from the side of the lower electrode 22; and the device 70 satisfies the following expression (5)" when the refractive index of the lower electrode 22 is represented by n5, those of the third color changing medium 30 and 32 are represented by n6(1) and n6(2), respectively, and that of the supporting substrate 10 is represented by n8.

As illustrated in FIG. 3, the organic EL display device 70 of the second embodiment preferably has the first transparent resin layer 34, that is, the layer corresponding to a flattening layer, an overcoat layer, an inter-insulator or the like.

$$n5 \geq n6(1) \geq n6(2) \geq n8 \qquad (5)''$$

Figure 14:
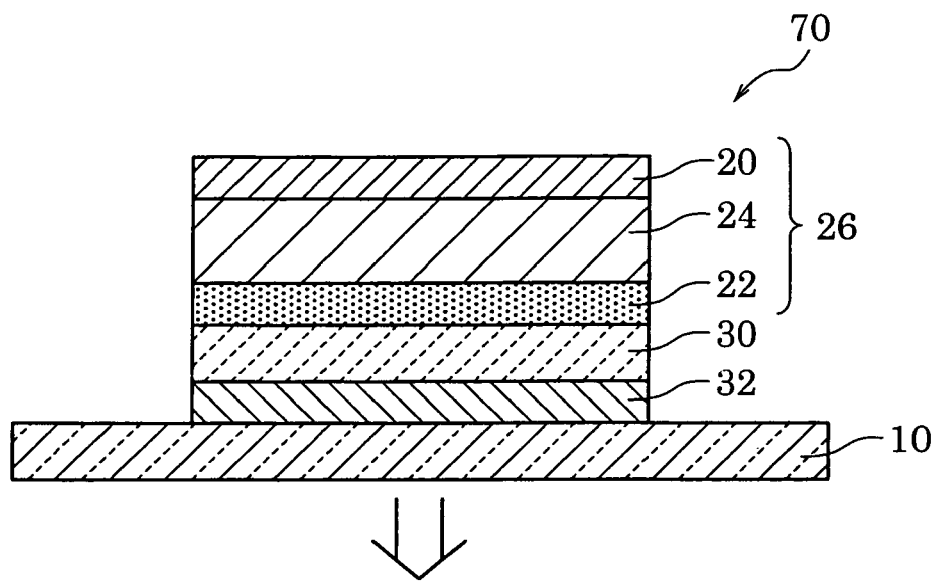
FIG. 14 is a sectional view of an organic EL display device in an embodiment where the color changing medium is directly in contact with the lower electrode.

As is roughly illustrated in FIG. 14, an organic EL display device of the second embodiment can have the following characteristics: the device 70 comprises, on a supporting substrate 10, a color changing medium including fluorescent medium 30 and color filter 32, and an organic EL element 26 made of an organic luminescent medium 24 sandwiched between a lower electrode 22 and an upper electrode 20; EL emission is taken out from the side of the lower electrode 22; and the device satisfies the following expression (5) when the refractive index of the lower electrode 22 is represented by n5, that of the color changing medium including fluorescent medium 30 and color filter 32 is represented by n6, and that of the supporting substrate is represented by n8.

$$n5 \geq n6 \geq n8 \qquad (5)$$

Figure 15:
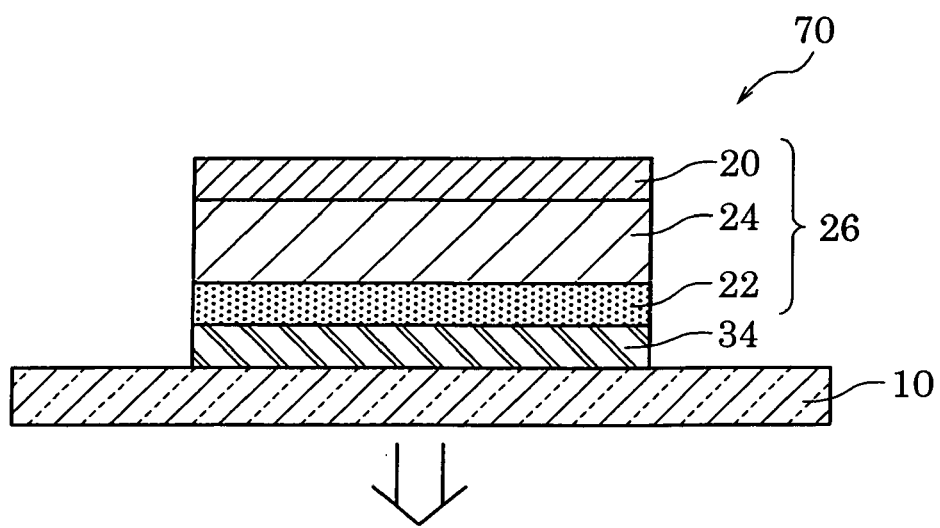
FIG. 15 is a sectional view of an organic EL display device in an embodiment where the transparent layer is the only member between the supporting substrate and the lower electrode.

As is roughly illustrated in FIG. 15, an organic EL display device of the second embodiment can have the following characteristics: the device 70 comprises, on a supporting substrate 10, a transparent resin layer 34, and an organic EL element 26 made of an organic luminescent medium 24 sandwiched between a lower electrode 22 and an upper electrode 20; EL emission is taken out from the side of the lower electrode 22; and the device satisfies the following expression (6) when the refractive index of the lower electrode 22 is represented by n5, that of the transparent resin layer 34 is represented by n7, and that of the supporting substrate is represented by n8.

$$n5 \geq n7 \geq n8 \qquad (6)$$

Referring to FIG. 3, the following will describe a characteristic color filter; a fluorescent medium for giving light having a color different from that of EL emission; and so on in the second embodiment.

(1) Refractive Index

① Expression (5)

By satisfying the expression (5) in the second embodiment, the reflectivity of EL emission on interfaces between the respective layers can be lowered even if the third color changing medium is provided. Thus, an organic EL display device having a large luminescent quantity can be provided.

For example, in the case that light is radiated from indium zinc oxide (IZO, refractive index: 2.1) as the lower electrode and then the light comes through the third color changing medium (refractive index: 1.7) into the supporting substrate (refractive index: 1.5), the light quantity incoming in the supporting substrate becomes a high value of 98.6% of the light quantity (100%) outgoing from the IZO on the assumption that the light absorbance of the respective layers themselves are 0%.

② Expression (8)

As illustrated in FIG. 3, when the first transparent resin layer 34 is arranged between the lower electrode 22 and the third color changing medium 30 and 32 and the refractive index of the first transparent resin layer 34 is represented by n7, it is preferred that the above-mentioned expression (5) is satisfied and the expression (8) is also satisfied.

$$n5 \geq n7 \geq n6 \geq n8 \qquad (8)$$

In the case that light is radiated from the lower electrode made of, for example, indium zinc oxide (IZO, refractive index: 2.1) and then the light comes through the first transparent resin layer (refractive index: 1.7) and the third color changing medium(refractive index: 1.6) into the supporting substrate (refractive index: 1.5), by the above-mentioned structure the light quantity incoming in the supporting substrate becomes a high value of 99% of the light quantity (100%) outgoing from the lower electrode on the assumption that the light absorbance of the respective layers themselves are 0%.

③ Expression (7)

When a transparent resin layer (which may be referred to as a second transparent resin layer) is set between the third color changing medium and the supporting substrate and the refractive index of the second transparent resin layer is represented by n7, it is preferred to satisfy the above-mentioned expression (5) and further satisfy the following expression (7):

$$n5 \geq n6 \geq n7 \geq n8 \qquad (7)$$

In the case that light is radiated from the lower electrode made of, for example, indium zinc oxide (IZO, refractive index: 2.1) and then the light comes through the third color changing medium (refractive index: 1.6) and the second transparent resin layer (refractive index: 1.6) into the supporting substrate (refractive index: 1.5), by the above-mentioned structure the light quantity incoming in the supporting substrate becomes a high value of 98% of the light quantity (100%) outgoing from the lower electrode on the assumption that the light absorbance of the respective layers themselves are 0%.

④ Expression (11)

It is also preferred that the refractive index n5 of the lower electrode and the refractive index n6 of the third color changing medium satisfy the above-mentioned expression (5) and further satisfy the following expression (11):

$$n6 \geq 0.7 \times n5 \quad (11)$$

In the case that light is radiated from the lower electrode made of, for example, indium zinc oxide (IZO, refractive index: 2.1) and then the light comes through the third color changing medium(refractive index: 1.55) into the supporting substrate (refractive index: 1.5), by the above-mentioned structure the light quantity incoming in the supporting substrate becomes a high value of 98% of the light quantity (100%) outgoing from the lower electrode on the assumption that the light absorbance of the respective layers themselves are 0%.

(2) Color Filter

① Structure

The color filter is set in order to decompose or cut light rays to adjust color or improve contrast, and is comprising of a colorant layer consisting only of a colorant or a layer wherein a colorant is dissolved or dispersed in a binder resin.

The structure of the color filter preferably comprises blue, green and red colorants. This is because combination of such a color filter with the organic EL element giving white luminescence makes it possible to obtain the three primary colors of light, blue, green and red colors, and attain full color display.

The color filter is preferably patterned by printing or photolithography as in the fluorescent medium.

② Thickness of the Color Filter

The thickness of the color filter is not particularly limited if the thickness causes luminescence of the organic EL element to be sufficiently received (absorbed) and does not block color changing function. For example, the thickness is preferably in the range of 10 nm to 1,000 μm, is more preferably in the range of 0.5 μm to 500 μm, and is still more preferably in the range of 1 μm to 100 μm.

(3) Fluorescent Medium

① Structure

The fluorescent medium in the organic EL display device has a function of absorbing luminescence of the organic EL element to give fluorescence having longer wavelengths, and is comprising of layer arranged separately in plane. Each of the fluorescent medium layers is preferably arranged correspondingly to the luminescent area of the organic EL element, for example, the position of the portion where the lower electrode and the upper electrode cross each other. In the case that the organic luminescent layer at the portion where the lower electrode and the upper electrode cross each other gives light, such a structure as above makes it possible that the respective fluorescent medium layers receive the light so that luminescence rays having different colors (wavelengths) can be taken out. A structure wherein the organic EL element emits blue light and further the light can be changed to green and red luminescence rays by the fluorescent medium is particularly preferred since the three primary colors of light, blue, green and red colors, can be obtained even from the single organic EL element so that full color display can be attained.

② Constituent Material

The constituent material of the fluorescent medium is not particularly limited and is made of, for example, a fluorescent dye and a resin, or only a fluorescent dye. The fluorescent dye and the resin may be those in a solid state wherein the fluorescent dye is dissolved or dispersed in a pigment resin and/or a binder resin.

Specific examples of the fluorescent dye will be described. Examples of the fluorescent dye for changing rays within the range from near-ultraviolet rays to violet luminescence rays in the organic EL element to blue luminescence rays include stylbene colorants such as 1,4-bis(2-methylstyryl)benzene (referred to as Bis-MBS hereinafter) and trans-4,4'-diphenyl-stylbene (referred to as DPS hereinafter); and coumarin dyes such as 7-hydroxy-4-methylcoumarin (referred to as coumarin 4 hereinafter).

Examples of the fluorescent dye for changing blue, bluish green or white luminescence rays in the organic EL element to green luminescence rays include coumarin dye such as 2,3,5,6-1H,4H-tetrahydro-8-trifluoromethylquinolidino(9,9a,1-gh)coumarin (referred to as coumarin 153 hereinafter), 3-(2'-benzothiazolyl)-7-diethylaminocoumarin (referred to as coumarin 6) and 3-(2'-benzimidazolyl)-7-N,N-diethylaminocoumarin (referred to as coumarin 7 hereinafter); Basic Yellow 51, which is a coumarin colorant type dye; and naphthalimide dyes such as Solvent Yellow 11 and Solvent Yellow 116.

Examples of the fluorescent colorant for changing luminescence rays within blue to green luminescence rays, or white luminescence rays in the organic EL element to luminescence rays within orange to red luminescence rays include cyanine dyes such as 4-dicyanomethylene-2-methyl-6-(p-dimethylaminostyryl)-4H-pyran (referred to as DCM hereinafter); pyridine dyes such as 1-ethyl-2-(4-(p-dimethylaminophenyl)-1,3-butadienyl)-pyridinium-perchlorate (referred to as pyridine 1); rhodamine dyes such as Rhodamine B and Rhodamine 6G; and oxadine colorants.

Various dyes (direct dyes, acidic dyes, basic dyes, disperse dyes and so on) can be selected as fluorescent colorants if they have fluorescent property.

The fluorescent dye may be beforehand kneaded into the following pigment resin to be made into a pigment: polymethacrylic acid ester, polyvinyl chloride, vinyl chloride vinyl acetate copolymer, alkyd resin, aromatic sulfonamide resin, urea resin, melamine resin, benzoguanamine resin or the like.

The binder resin is preferably a material having transparency (light transmittance to visible rays: 50% or more). Examples thereof are transparent resins (polymers) such as polymethyl methacrylate, polyacrylate, polycarbonate, polyvinyl alcohol, polyvinyl pyrrolidone, hydroxyethylcellulose, and carboxymethylcellulose.

In order to arrange the fluorescent medium separately in plane, a photosensitive resin to which photolithography can be applied may be selected. Examples thereof are photosetting resist materials having reactive vinyl groups, such as acrylic acid type, methacrylic acid type, polyvinyl cinnamate type and cyclic rubber type materials. In the case that printing is used, a printing ink (medium) using a transparent resin is selected. For example, the following may be used: a monomer, an oligomer or a polymer of polyvinyl chloride resin, melamine resin, phenol resin, alkyd resin, epoxy resin, polyurethane resin, polyester resin, maleic acid resin or polyamide resin; or a transparent resin such as polymethyl methacrylate, polyacrylate, polycarbonate, polyvinyl alcohol, polyvinyl pyrrolidone, hydroxyethylcellulose or carboxymethylcellulose.

③ Refractive Index

For reference, the refractive indexes of materials constituting preferred fluorescent medium are as follows:

| | |
|---|---|
| vinyl chloride resin | 1.54 |
| vinylidene chloride resin | 1.60 |
| vinyl acetate resin | 1.45 |
| polyethylene resin | 1.51 |
| polystyrene resin | 1.59 |
| methyl methacrylate resin | 1.49 |
| melamine resin | 1.60 |

It is proved that these refractive indexes change by dissolving or dispersing a dye for the fluorescent medium (or a colorant for the color filter). In the present invention, therefore, the refractive index can be adjusted by selecting a suitable material appropriately.

④ Forming Method

In the case that the fluorescent medium is made mainly of a fluorescent dye, a film thereof is preferably formed by vacuum deposition or sputtering through a mask for obtaining a desired fluorescent medium pattern.

On the other hand, in the case that the fluorescent medium is made of a fluorescent dye and a resin, the fluorescent medium is preferably formed by mixing the fluorescent dye and the resin with an appropriate solvent or dispersing or dissolving the fluorescent dye and the resin in the solvent to prepare a liquid material, making the liquid material into a film by spin coating, roll coating, casting or the like and subsequently patterning the film into a desired pattern by photolithography or screen printing or the like.

⑤ Thickness

The thickness of the fluorescent medium is not particularly limited if the thickness causes luminescence of the organic EL element to be sufficiently received (absorbed) and does not block fluorescence generating function. For example, the thickness is preferably in the range of 10 nm to 1,000 μm, is more preferably in the range of 0.1 μm to 500 μm, and is still more preferably in the range of 5 μm to 100 μm.

The reason for this is as follows. If the thickness of the fluorescent medium is less than 10 nm, the mechanical strength thereof may drop or the lamination thereof may become difficult. On the other hand, if the thickness of the fluorescent medium is over 1 mm, the light transmittance thereof drops remarkably so that the quantity of light which can be taken out may drop or the organic EL display device may not be easily made thin.

Third Embodiment

Figure 8:
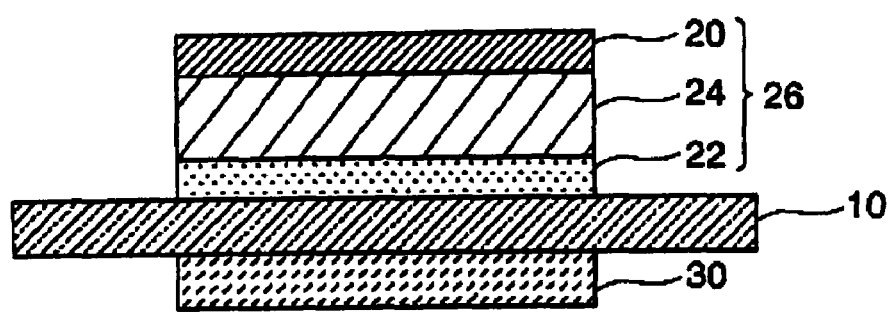
FIG. 8 is a sectional view of an organic EL display device in a third embodiment where the color changing medium is arranged on a surface of the supporting substrate, that surface being opposite to a surface on which the lower electrode is arranged.
Figure 8:
Figure 9:
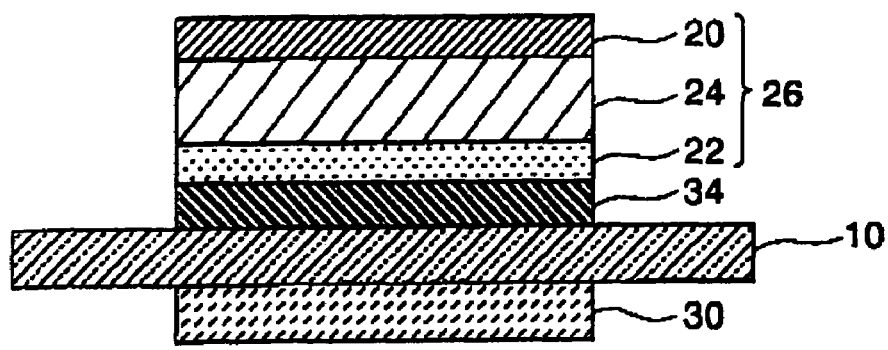
FIG. 9 is a sectional view of an organic EL display device in an embodiment where a transparent resin layer is arranged between the lower electrode and the supporting substrate.
Figure 9:
Figure 10:
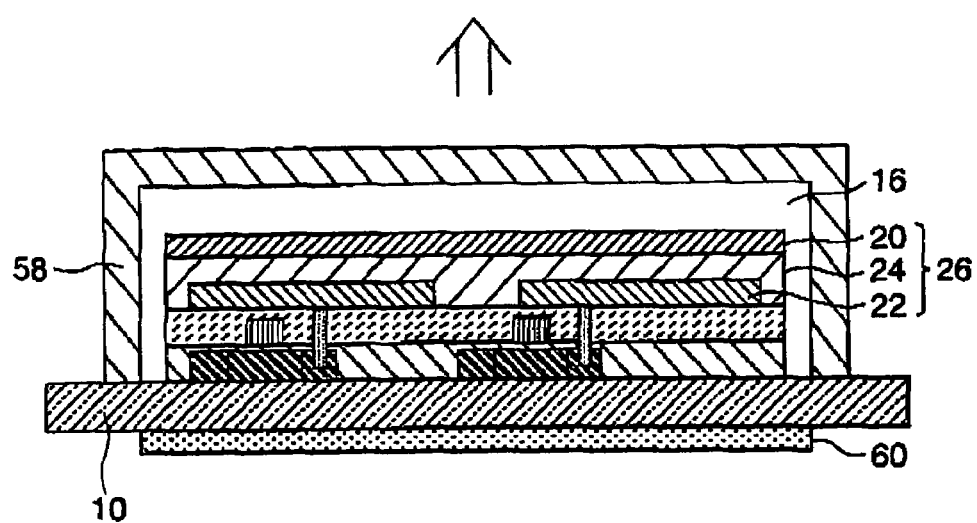
FIG. 10 is a sectional view of an organic EL display device in an embodiment where the color changing medium is arranged on a surface opposite to a surface on which the sealing medium is arranged.
Figure 11:
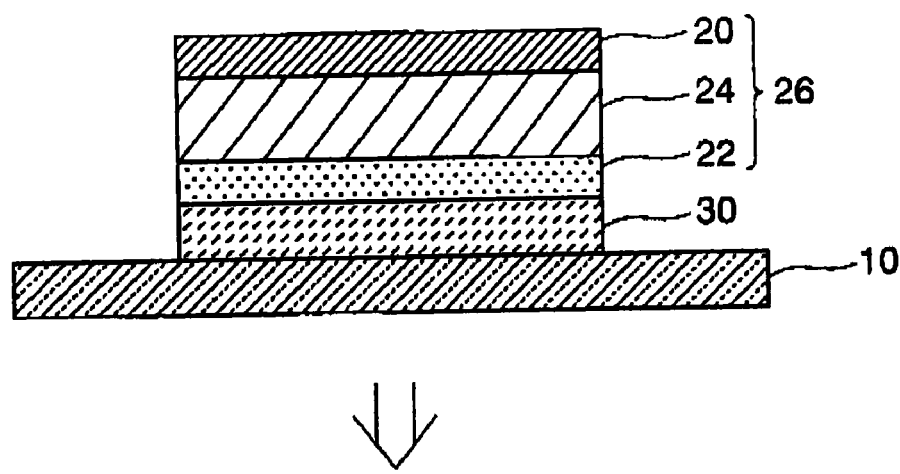
FIG. 11 is a sectional view of an organic EL display device in an embodiment where the color changing medium is arranged between the supporting substrate and the lower electrode in contact with the lower electrode.
Figure 12:
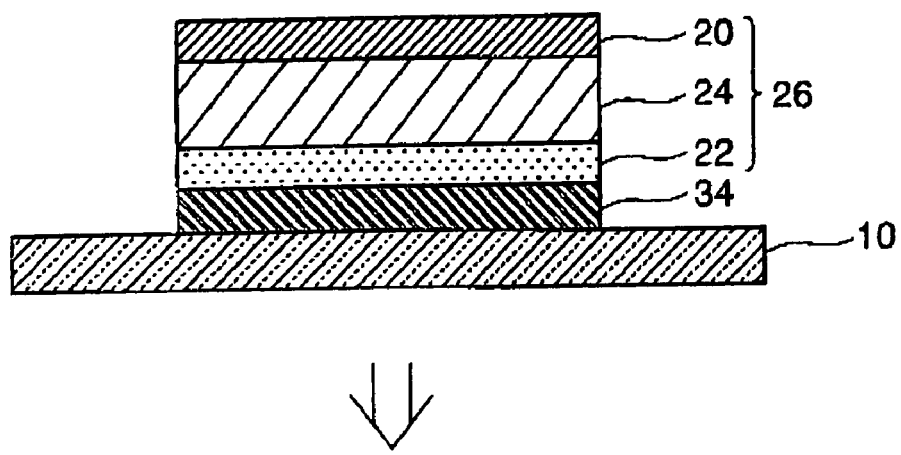
FIG. 12 is a sectional view of an organic EL display device in an embodiment where the transparent resin layer is the only member between the supporting substrate and the lower electrode.
Figure 13:
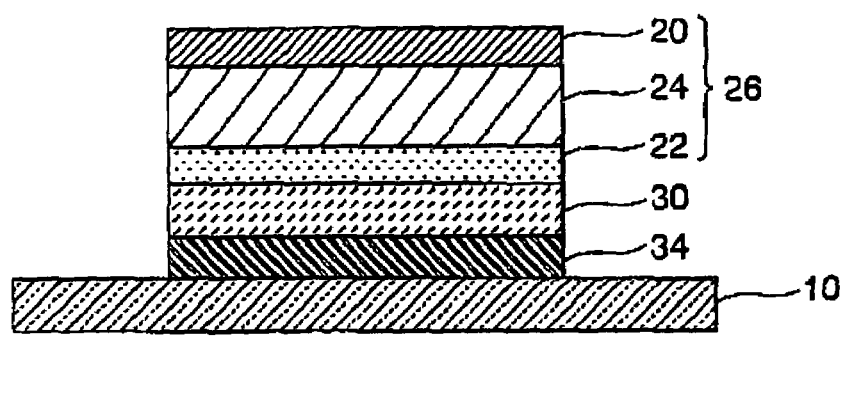
FIG. 13 is a sectional view of an organic EL display device in an embodiment where the color changing medium and the transparent resin layer are arranged between the supporting substrate and the lower electrode in the order of the supporting substrate, the transparent resin layer, the color changing medium. and the lower electrode.

As illustrated in FIG. 8, an organic EL display device of the third embodiment is an organic EL display device having the following characteristics: the device comprises a color changing medium (which may be referred to as a fourth color changing medium), a supporting substrate, a transparent resin layer (which may be referred two as a third transparent resin layer), a lower electrode, an organic luminescent medium and an upper electrode successively from the lower side thereof; EL emission is taken through the fourth color changing medium from the side of the lower electrode; and the device satisfies the following expression (9) when the refractive index of the lower electrode is represented by $n5$, that of the fourth color changing medium is represented by $n9$, and that of the supporting substrate is represented by $n8$:

$$n5 \geq n8 \geq n9 \qquad (9)$$

The following will describe a characteristic relationship between the refractive indexes of the respective layers, and so on in the third embodiment. The fourth color changing medium can be made the same as the third color changing medium described in the second embodiment.

(1) Expression (9)

By satisfying the expression (9) in the third embodiment, the reflectance of EL emission on interfaces between the respective layers can be lowered even if the fourth color changing medium is arranged on the side, opposite to the side on which the organic EL element is arranged, of the supporting substrate. Thus, an organic EL display device having a large luminescent quantity can be provided.

For example, in the case that light is radiated from indium zinc oxide (IZO, refractive index: 2.1) as the lower electrode and then the light comes into the supporting substrate (refractive index: 1.5) and then emits through the fourth color changing medium (refractive index: 1.5) outside, the light quantity incoming in the fourth color changing medium becomes a high value of 97.2% of the light quantity (100%) incoming from the lower electrode to the supporting substrate on the assumption that the light absorbance of the respective layers themselves are 0%.

(2) Expression (10)

When the third transparent resin layer is arranged between the lower electrode and the supporting substrate and the refractive index of the third transparent resin layer is represented by $n7$, it is preferred to satisfy the above-mentioned expression (9) and further satisfy the following expression (10):

$$n5 \geq n7 \geq n8 \geq n9 \qquad (10)$$

In the case that light is radiated from the lower electrode made of, for example, indium zinc oxide (IZO, refractive index: 2.1) and then the light comes through the third transparent resin layer (refractive index: 1.7) into the supporting substrate (refractive index: 1.5) and subsequently emits through the fourth color changing medium (refractive index: 1.5) outside, by the above-mentioned structure the light quantity incoming in the fourth color changing medium becomes a high value of 98.5% of the light quantity (100%) incoming from the lower electrode to the supporting substrate on the assumption that the light absorbance of the respective layers themselves are 0%.

(3) Expression (12)

It is also preferred that the refractive index $n5$ of the lower electrode and the refractive index $n7$ of the third transparent resin layer arranged between the lower electrode and the supporting substrate satisfy the above-mentioned expression (10) and further satisfy the following expression (12):

$$n7 \geq 0.7 \times n5 \qquad (12)$$

In the case that light is radiated from the lower electrode made of, for example, indium zinc oxide (IZO, refractive index: 2.1) and then the light comes through the third transparent resin layer (refractive index: 1.55) into the supporting substrate (refractive index: 1.5), by the above-mentioned structure the light quantity outgoing from the fourth color changing medium becomes a high value of 97.2% of the light quantity (100%) incoming from the lower electrode into the supporting substrate on the assumption that the light absorbance of the respective layers themselves are 0%.

EXAMPLES

Example 1

(1) Manufacture of Fluorescent Medium

A ball mill was used to mix homogeneously 100 g of an acrylic type photo-setting resist 259PA having a fluorene skeleton (made by Shin Nippon Steel chemical Co., Ltd. Solid content: 50% by weight, and propylene glycol ether methyl ether acetate was used as a solvent) as a photo-setting resin, 0.53 g of coumarin 6 as an organic fluorescent dye, 1.5 g of Basic Violet 11, 1.5 g of Rhodamine 6G and 25 g of propylene glycol methyl ether acetate as a solvent, so as to prepare a composition for a fluorescent medium (an ink for a fluorescent medium).

The resultant fluorescent medium composition was applied onto a glass substrate (Corning 7059) 25 mm in length, 75 mm in width and 1.1 mm in thickness by spin coating, and then dried at 80° C. for 10 minutes. Next, ultraviolet rays (wavelength: 365 nm) were radiated thereon in such a manner that the quantity of light exposure would be 1,500 mJ/cm$^2$, to form the fluorescent medium.

The refractive index of the fluorescent medium was measured, so that it was 1.62. In the same way, the refractive index of the glass substrate was measured, so that it was 1.50.

In this way, a sealing member in which the fluorescent medium was formed was manufactured.

(2) Manufacture of Organic EL Elements

A glass substrate (Corning 7059) 25 mm in length, 75 mm in width and 1.1 mm in thickness was cleaned with isopropyl alcohol and ultraviolet rays, and subsequently this substrate was fixed onto a substrate holder inside a vacuum deposition machine (ULVAC, Co., Ltd.).

Next, a heating board made of molybdenum inside the vacuum evaporation machine was filled with 4,4',4"-tris[N-(3-methylphenyl)-N-phenylamino]triphenylamine (MT-DATA) and 4,4'-bis[N-(1-naphthyl)-N-phenylamino]biphenyl (NPD) as hole injection materials, 4,4'-bis(2,2-diphenylvinyl)biphenyl (DPVBi) as an organic luminescent material, and tris(8-quinolynol)aluminum (Alq) as an electron injection material, and further an Al/Li alloy (Li content by percentage: 5% by weight) as a constituent material of lower electrodes (cathodes) was fitted to the heating board.

In this state, the evacuated pressure of the deposition machine was reduced to $655 \times 10^{-7}$ Pa and then the above-mentioned materials were deposited by single vacuum drawing operation, without canceling the vacuum state on its way from the formation of the cathodes to the formation of a hole injection layer, in such a manner that the following deposition rates and film thicknesses would be attained.

MTDATA: deposition rate: 0.1 to 0.3 nm/sec., film thickness: 60 nm,

NPD: deposition rate: 0.1 to 0.3 nm/sec., film thickness: 20 nm,

DPVBi: deposition rate: 0.1 to 0.3 nm/sec., film thickness: 50 nm,

Alq: deposition rate: 0.1 to 0.3 nm/sec., film thickness: 20 nm, and

Al/Li alloy: deposition rate: 1.0 to 2.0 nm/sec., film thickness: 150 nm.

Next, the substrate was moved to a sputtering machine, and then IZO (refractive index: 2.1) for upper electrodes was sputtered into a film to have a thickness of 200 nm. In this way, organic EL elements were manufactured.

(3) Sealing Step

The organic EL elements obtained in the above-mentioned (2) were put into a dry box which dry nitrogen was introduced. O-PET resin (refractive index: 1.63), which is a polyester resin having a fluorene skeleton, was laminated on the luminescent faces (on the upper electrodes) of the organic EL elements so as to form a film of the sealing medium.

Next, the glass substrate on which the fluorescent medium (refractive index: 1.62) obtained in the above-mentioned (1) was formed, that is, the sealing member (refractive index: 1.5) was laminated on the sealing medium.

In other words, the refractive index (n1: 2.1) of the upper electrodes in the organic EL elements, the refractive index (n2: 1.63) of the sealing medium, the refractive index (n4: 1.62) of the first color changing medium, and the refractive index (n3: 1.5) of the sealing member were arranged in this way to satisfy the expression (2).

The peripheral portion thereof was treated with a cation-setting adhesive agent TB3102 (made by Three Bond Co., Ltd.), and then the agent was set by light to make the resultant workpiece airtight. In this way, an organic EL display device of Example 1 was manufactured.

(4) Evaluation of the Organic EL Display Device

In Example 1, for evaluation of the first invention, a DC voltage of 12 V was applied through an active matrix circuit between the upper electrodes (anodes, IZO) of the resultant organic EL display device and the lower electrodes (cathode, Al/Li) thereof to give luminescence.

A chroma meter CS1000 (made by Minolta Co., Ltd.) was used to measure the luminescent brightness. As a result, a value of 62 cd/m$^2$ was obtained. It was proved that the CIE chromaticity coordinates of the resultant red luminescence were as follows: X=0.62 and Y=0.34.

Comparative Example 1

In Comparative Example 1, a comparative example about the first invention was evaluated. Accordingly, in Comparative Example 1, an organic EL display device was manufactured and evaluated in the same manner as in Example 1 except that a silicone oil (refractive index: 1.55) was filled and used instead of the O-PET resin used in Example 1. That is, an organic EL display device was formed in the manner that the refractive index (n1) of the upper electrodes, that (n2) of the sealing medium, that (n4) of the color changing medium and that (n3) of the sealing member did not satisfy the relational expression (2).

Next, in the same way as in Example 1, the luminescent brightness of the resultant organic EL display device was measured with chroma meter CS1000. As a result, a value of 55 cd/m$^2$ was obtained as shown in Table 1. Red EL emission was obtained. It was proved that the CIE chromaticity coordinates thereof were as follows: X=0.62 and Y=0.34.

Thus, in Comparative Example 1 the same organic EL elements as in Example 1 were used, but it was proved that the luminescent brightness was reduced by about 11%.

It was demonstrated that when such silicone oil was used, the organic EL elements were broken out after several minutes from the measurement of the luminescent brightness so that EL emission could not be obtained.

TABLE 1

| Side from which luminescence was taken out | | n1 | n2 | n4 | n3 | Luminescent brightness (cd/m$^2$) |
|---|---|---|---|---|---|---|
| Example 1 | Upper electrode side | 2.1 | 1.63 | 1.62 | 1.50 | 62 |
| Comparative Example 1 | Upper electrode side | 2.1 | 1.55 | 1.62 | 1.50 | 55 |
| Comparative Example 2 | Upper electrode side | 2.1 | 1.30 | 1.62 | 1.50 | 50 |
| Comparative Example 3 | Upper electrode side | 2.1 | 1.00 | 1.62 | 1.50 | 29 |

Comparative Example 2

In Comparative Example 2, a comparative example about the first invention was evaluated. Accordingly, in Comparative Example 2, an organic EL display device was manufactured and evaluated in the same manner as in Example 1 except that fluorinated hydrocarbon liquid Florinate (made by Sumitomo 3M Limited, refractive index: 1.3) was filled and used instead of the O-PET resin in Example 1. That is, an organic EL display device was formed in the manner that the respective refractive indexes did not satisfy the expression (2).

Next, a DC voltage of 12 V was applied through an active matrix circuit between the upper electrodes (anodes, IZO) of the resultant organic EL display device and the lower electrodes (cathodes, Al/Li) thereof. The chroma meter CS1000 was used to measure the luminescent brightness.

As a result, a luminescent brightness value of 50 cd/m$^2$ was obtained. It was proved that the CIE chromaticity coordinates of the resultant red luminescence were as follows: X=0.62 and Y=0.34.

Thus, in Comparative Example 2 the same organic EL elements as in Example 1 were used, but it was proved that the luminescent brightness was reduced by about 19%.

Comparative Example 3

In Comparative Example 3, a comparative example about the first invention was evaluated. Accordingly, in Comparative Example 3, an organic EL display device was manufactured and evaluated in the same manner as in Example 1 except that dry nitrogen (refractive index: 1.0) was filled and used instead of the O-PET resin in Example 1. That is, an organic EL display device was formed in the manner that the respective refractive indexes did not satisfy the relational expression (2).

Next, a DC voltage of 12 V was applied through an active matrix circuit between the upper electrodes (anodes, IZO) of the resultant organic EL display device and the lower electrodes (cathodes, Al/Li) thereof. The chroma meter CS1000 was used to measure the luminescent brightness.

As a result, a luminescent brightness value of 29 cd/m$^2$ was obtained. It was proved that the CIE chromaticity coordinates of the resultant red luminescence were as follows: X=0.62 and Y=0.34.

Thus, in Comparative Example 3 the same organic EL elements as in Example 1 were used, but it was proved that the luminescent brightness was reduced by about 50%.

Example 2

In Example 2, the second invention was evaluated. Accordingly, in Example 2 an organic EL display device wherein a first transparent resin layer 34 was arranged between a lower electrode 22 and second changing medium 30 and 32 and further EL emission was taken out from the lower electrode side, as illustrated in FIG. 3, was manufactured and evaluated.

That is, ITO (refractive index: 1.8) was used as the lower electrode (transparent electrode), the O-PET resin (refractive index: 1.63) used in Example 1 was used as the first transparent resin layer, and the second changing medium comprising of the fluorescent medium 30 and the color filter 32 (refractive index of the combination of the two: 1.62) were arranged thereon. Furthermore, a glass substrate (refractive index: 1.50) was used as a supporting substrate 10. In this way, an organic EL display device was formed in the manner that the values of the respective refractive indexes satisfy the expression (8).

Next, a DC voltage of 12 V was applied through an active matrix circuit between the lower electrodes (anodes, ITO) of the resultant organic EL display device and the upper electrodes (cathodes, Al/Li) thereof. The chroma meter CS1000 was used to measure the luminescent brightness.

As a result, a high value of 75 cd/m$^2$ was obtained. It was proved that the CIE chromaticity coordinates of the resultant red luminescence were as follows: X=0.62 and Y=0.34.

TABLE 2

| Side from which luminescence was taken out | | n5 | n7 | n6 | n8 | Luminescent brightness (cd/m$^2$) |
|---|---|---|---|---|---|---|
| Example 2 | Lower electrode side | 1.8 | 1.63 | 1.62 | 1.50 | 75 |
| Comparative Example 4 | Lower electrode side | 1.8 | 1.50 | 1.62 | 1.50 | 60 |

Comparative Example 4

In Comparative Example 4, a comparative example about the second invention was evaluated. Accordingly, in Comparative Example 4 an organic EL display device was manufactured and evaluated in the same manner as in Example 2 except that a SiOx sputtering film (refractive index: 1.50) was used instead of the O-PET resin in Example 2. That is, an organic EL display device was manufactured in the manner that the refractive index values did not satisfy the expression (8).

Next, a DC voltage of 12 V was applied through an active matrix circuit between the lower electrodes (anodes, ITO) of the resultant organic EL display device and the upper electrodes (cathodes, Al/Li) thereof. The chroma meter CS1000 was used to measure the luminescent brightness.

As a result, a luminescent brightness value of 60 cd/m$^2$ was obtained. It was proved that the CIE chromaticity coordinates of the resultant red luminescence were as follows: X=0.62 and Y=0.34.

Thus, in Comparative Example 4 the same organic EL elements as in Example 2 were used, but it was proved that the luminescent brightness was reduced by about 20%.

Example 3

In Example 3, another embodiment of the second invention was evaluated. Accordingly, in Example 3 an organic EL display device was manufactured and evaluated in the same manner as in Example 2 except that no color changing medium was arranged. That is, an organic EL display device was formed in the manner that the refractive index (n5) of the lower electrodes, that (n7) of the transparent resin layer and that (n8) of the supporting substrate satisfied the expression (6).

Next, a DC voltage of 12 V was applied through an active matrix circuit between the lower electrodes (anodes, ITO) of the resultant organic EL display device and the upper electrodes (cathodes, Al/Li) thereof. The chroma meter CS1000 was used to measure the luminescent brightness.

As a result, a high luminescent brightness value of 200 cd/M$^2$ was obtained. It was proved that the CIE chromaticity coordinates of the resultant blue luminescence were as follows: X=0.14 and Y=0.20.

TABLE 3

| | Side from which luminescence was taken out | n5 | n7 | n8 | Luminescent brightness (cd/m$^2$) |
|---|---|---|---|---|---|
| Example 3 | Lower electrode side | 1.8 | 1.63 | 1.50 | 200 |
| Comparative Example 5 | Lower electrode side | 1.8 | 1.43 | 1.50 | 150 |

Comparative Example 5

In Comparative Example 5, a comparative example about the second invention was evaluated. Accordingly, in Comparative Example 5, an organic EL display device was manufactured and evaluated in the same manner as in Example 3 except that polytrifluoroethylene (refractive index: 1.43) was used instead of the O-PET resin as the transparent resin layer in Example 3. That is, an organic EL display device was formed in the manner that refractive index (n5) of the lower electrodes, that (n7) of polytrifluoroethylene and that (n8) of the supporting substrate did not satisfy the expression (6).

Next, a DC voltage of 12 V was applied through an active matrix circuit between the lower electrodes (anodes, ITO) of the resultant organic EL display device and the upper electrodes (cathodes, Al/Li) thereof. The chroma meter CS1000 was used to measure the luminescent brightness.

As a result, a value of 150 cd/m$^2$ was obtained. It was proved that the CIE chromaticity coordinates of the resultant blue luminescence were as follows: X=0.14 and Y=0.20.

Thus, in Comparative Example 5 the same organic EL elements as in Example 3 were used, but it was proved that the luminescent brightness was reduced by about 25%.

Example 4

In Example 4, the third invention was evaluated. Accordingly, in Example 4 an organic EL display device was manufactured and evaluated in the same way as in Example 3 except that a fourth color changing medium was arranged on the side, opposite to the side on which the transparent resin layer was arranged, of the supporting substrate, PMMA (polymethyl methacrylate resin) was used as matrix material to provide the refractive index of the fourth color changing medium to 1.5, and further the lower electrodes (anodes) were composed of IZO.

That is, an organic EL display device was formed in the manner that the refractive index (n5) of the lower electrodes, that (n7) of the transparent resin layer, that (n8) of the supporting substrate and that (n9) of the fourth color changing medium satisfied the expression (10).

Next, a DC voltage of 12 V was applied through an active matrix circuit between the lower electrodes (anodes, IZO) of the resultant organic EL display device and the upper electrodes (cathodes, Al/Li) thereof. The chroma meter CS1000 was used to measure the luminescent brightness.

As a result, a luminescent brightness value of 57 cd/m$^2$ was obtained. It was proved that the CIE chromaticity coordinates of the resultant red luminescence were as follows: X=0.62 and Y=0.34.

TABLE 4

| | Side from which luminescence was taken out | n5 | n7 | n8 | n9 | Luminescent brightness (cd/m$^2$) |
|---|---|---|---|---|---|---|
| Example 4 | Lower electrode side | 2.1 | 1.63 | 1.50 | 1.50 | 57 |
| Comparative Example 6 | Lower electrode side | 2.1 | 1.43 | 1.50 | 1.50 | 45 |

Comparative Example 6

In Comparative Example 6, a comparative example about the third invention was evaluated. Accordingly, in Comparative Example 6 an organic EL display device was manufactured and evaluated in the same manner as in Example 4 except that polytrifluoroethylene (refractive index: 1.43) was used instead of the transparent resin layer in Example 4. That is, an organic EL display device was formed in the manner that refractive index (n5) of the lower electrodes, that (n7) of polytrifluoroethylene and that (n8) of the supporting substrate did not satisfy the expression (10).

Next, a DC voltage of 12 V was applied through an active matrix circuit between the lower electrodes (anodes, IZO) of the resultant organic EL display device and the upper electrodes (cathodes, Al/Li) thereof. The chroma meter CS1000 was used to measure the luminescent brightness.

As a result, a luminescent brightness value of 45 cd/m$^2$ was obtained. It was proved that the CIE chromaticity coordinates of the resultant red luminescence were as follows: X=0.62 and Y=0.34.

Thus, in Comparative Example 6 the same organic EL elements as in Example 4 were used, but it was proved that the luminescent brightness was reduced by about 21%.

Example 5

In Example 5, the first invention was evaluated. That is, an organic EL display device was manufactured under the same conditions as in Example 1 except that a sealing member having no fluorescent medium was used.

Namely, an organic EL display device was formed in the manner that the refractive index (n1: 2.1) of the upper electrodes in the organic EL element, that (n2: O-PET resin 1.63) of the sealing medium, and that (n3: 1.5) of the sealing member satisfied the expression (1).

Next, a DC voltage of 12 V was applied through an active matrix circuit between the upper electrodes (anodes, IZO) of the resultant organic EL display device and the lower electrodes (cathodes, Al/Li) thereof to give luminescence.

The chroma meter CS1000 (made by Minolta Co., Ltd.) was used to measure the luminescent brightness. As a result, a value of 200 cd/m$^2$ was obtained. It was proved that the CIE chromaticity coordinates of the resultant blue luminescence were as follows: X=0.15 and Y=0.16.

Comparative Example 7

In Comparative Example 7, a comparative example about the first invention was evaluated. Accordingly, in Comparative Example 7 an organic EL display device was manufactured and evaluated in the same manner as in Example 5 except that nitrogen gas (refractive index: 1.00) was used as a sealing medium instead of the O-PET resin used in Example 5. That is, an organic EL display device was formed in the manner that refractive index (n1) of the upper electrodes, that (n2) of the sealing medium and that (n3) of the sealing member did not satisfy the expression (1).

Next, the chroma meter CS1000 was used to measure the luminescent brightness of the resultant organic EL display device in the same manner as in Example 5. As a result, a value of 160 cd/m$^2$ was obtained, as shown in Table 5. Blue luminescence was obtained. It was proved that the CIE chromaticity coordinates thereof were as follows: X=0.15 and Y=0.16.

Thus, in Comparative Example 7 the same organic EL elements as in Example 5 were used, but it was proved that the luminescent brightness was reduced by about 20%.

It was demonstrated that when nitrogen gas was used as the sealing medium in this way, the luminescent brightness dropped remarkably since the expression (1) was not satisfied.

TABLE 5

| | Side from which luminescence was taken out | n1 | n2 | n3 | Luminescent brightness (cd/m$^2$) |
|---|---|---|---|---|---|
| Example 5 | Upper electrode side | 2.1 | 1.63 | 1.50 | 200 |
| Comparative Example 7 | Upper electrode side | 2.1 | 1.00 | 1.50 | 160 |

INDUSTRIAL APPLICABILITY

According to the first invention (organic EL display device) of the present invention, the relationship between the refractive index of the sealing member and those of the electrode and so on is considered. According to the second invention (organic EL display device), the relationship between the refractive indexes of the color changing medium and the transparent resin and those of the electrode and so on is considered. According to the third invention (organic EL display device), the relationship between the refractive index of the color changing medium arranged outside the supporting substrate and those of the electrode and so on is considered. In these ways, reflection on the respective interfaces is suppressed and the quantity of EL emission which can be taken out can be made large even if silicone oil or the like is not used as the sealing medium.

The invention claimed is:

1. An organic electroluminescence display device comprising:
   a polymer supporting substrate being subjected to moisture-proof treatment or hydrophobic treatment by forming an inorganic film or applying a fluorine resin;
   an organic electroluminescence element comprising an organic luminescent medium sandwiched between a lower electrode and an upper electrode, on the supporting substrate; and
   a transparent resin layer being arranged between the supporting substrate and the lower electrode, the layer being the only member therebetween;
   the lower electrode being capable of transmitting an electroluminescence emission;
   wherein the following expression (6) is satisfied $$n5 \geq n7 \geq n8 \quad (6)$$

wherein n5 represents a refractive index of the lower electrode, n7 represents a refractive index of the transparent resin layer, and n8 represents a refractive index of the supporting substrate.

2. An organic electroluminescence display device comprising:
   a supporting substrate;
   an organic electroluminescence element comprising an organic luminescent medium sandwiched between a lower electrode and an upper electrode on the supporting substrate;
   a sealing medium; and
   a sealing member:
   the upper electrode being capable of transmitting an electroluminescence emission;
   the sealing medium comprising a transparent resin or a sealing liquid, wherein the transparent resin and the sealing liquid contain a fluorene skeleton containing compound. a bromine containing compound, or a sulfur containing compound as a refractive adjusting agent;
   wherein a following expression (1) is satisfied $$n1 \geq n2 \geq n3 \quad (1)$$

wherein n 1 represents a refractive index of the upper electrode, n2 represents a refractive index of the sealing medium, and n3 represents a refractive index of the sealing member.

3. The organic electroluminescence display device according to claim 2, wherein the device further comprises a color changing medium between the sealing medium and the sealing member; and
   a following expression (2) is satisfied $$n1 \geq n2 \geq n4 \geq n3 \quad (2)$$

wherein n4 represents a refractive index of the color changing medium.

4. The organic electroluminescence display device according to claim 2, wherein a thin film transistor for driving the organic electroluminescence element is arranged on the supporting substrate.

5. An organic electroluminescence display device comprising:
   a supporting substrate;
   an organic electroluminescence element comprising an organic luminescent medium sandwiched between a lower electrode and an upper electrode on the supporting substrate;
   a sealing medium; and
   a sealing member
   the upper electrode being capable of transmitting an electroluminescence emission;
   the sealing medium comprising a transparent resin or a sealing liquid, wherein the transparent resin and the sealing liquid contain an alkoxy titanium;
   wherein a following expression (1) is satisfied $$n1 \geq n2 \geq n3 \quad (1)$$

wherein n1 represents a refractive index of the upper electrode, n2 represents a refractive index of the sealing medium, and n3 represents a refractive index of the sealing member.

6. The organic electroluminescence display device according to claim 5, wherein the device further comprises a color changing medium between the sealing medium and the sealing member; and a following expression (2) is satisfied $$n1 \geq n2 \geq n4 \geq n3 \tag{2}$$

wherein n4 represents a refractive index of the color changing medium.

7. the organic electroluminescence display device according to claim 5, wherein a thin film transistor for driving the organic electroluminescence element is arranged on the supporting substrate.

8. An organic electroluminescence display device comprising:
- a polymer supporting substrate being subjected to moisture-proof treatment or hydrophobic treatment by forming an inorganic film or applying a fluorine resin;
- an organic electroluminescence element comprising an organic luminescent medium sandwiched between a lower electrode and an upper electrode, on the supporting substrate; and
- a transparent resin layer and a thin film transistor being arranged between the supporting substrate and the lower electrode, the layer and the transistor being the only members therebetween;
- the lower electrode being capable of transmitting an electroluminescence emission;
- wherein die following expression (6) is satisfied $$n5 \geq n7 \geq n8 \tag{6}$$

wherein n5 represents a refractive index of the lower electrode, n7 represents a refractive index of the transparent resin layer, and n8 represents a refractive index of the supporting substrate.

9. An organic electroluminescence display device comprising:
- a polymer supporting substrate being subjected to moisture-proof treatment or hydrophobic treatment by forming an inorganic film or applying a fluorine resin;
- an organic electroluminescence element comprising an organic luminescent medium sandwiched between a lower electrode and an upper electrode, on the supporting substrate; and
- a transparent resin layer without any color changing medium located between the supporting substrate and the lower electrode;
- the lower electrode being capable of transmitting an electroluminescence emission;
- wherein the following expression (6) is satisfied.

$$n5 \geq n7 \geq n8 \tag{6}$$

wherein n5 represents a refractive index of the lower electrode, n7 represents a refractive index of the transparent resin layer, and. n8 represents a refractive index of the supporting substrate.

10. An organic electroluminescence display device comprising,
- a supporting substrate;
- an organic electroluminescence element comprising an organic luminescent medium sandwiched between a lower electrode and an upper electrode on the supporting substrate:
- a sealing medium; and
- a sealing member;
- the upper electrode being capable of transmitting an electroluminescence emission;
- the sealing medium comprising a transparent resin selected from polyphenyl methacrylate, polyethylene terephthalate, poly-o-naphthyl methacrylate, polyvinyl napthalene, polyvinyl carbazole, and polyester containing fluorene skeleton;
- wherein a following expression (1) is satisfied $$n1 \geq n2 \geq n3 \tag{1}$$

wherein n1 represents a refractive index of the uper electrode, n2 represents a refractive index of the scaling medium, and n3 represents a refractive index of the sealing member.

* * * * *